United States Patent
Yang et al.

(10) Patent No.: US 9,529,353 B2
(45) Date of Patent: Dec. 27, 2016

(54) METHODS FOR LIMITING COUNTER-MASS TRIM-MOTOR FORCE AND STAGE ASSEMBLIES INCORPORATING SAME

(75) Inventors: Pai-Hsueh Yang, Palo Alto, CA (US); Michael B. Binnard, Belmont, CA (US); Scott Coakley, Belmont, CA (US)

(73) Assignee: Nikon Corporation, Tokyo (JP)

( * ) Notice: Subject to any disclaimer, the term of this patent is extended or adjusted under 35 U.S.C. 154(b) by 312 days.

(21) Appl. No.: 13/228,341

(22) Filed: Sep. 8, 2011

(65) Prior Publication Data

US 2012/0069316 A1 Mar. 22, 2012

Related U.S. Application Data

(60) Provisional application No. 61/381,022, filed on Sep. 8, 2010.

(51) Int. Cl.
*G03B 27/58* (2006.01)
*G03B 27/62* (2006.01)
*G05B 19/404* (2006.01)
*G03F 7/20* (2006.01)

(52) U.S. Cl.
CPC ......... *G05B 19/404* (2013.01); *G03F 7/70725* (2013.01); *G03F 7/70766* (2013.01)

(58) Field of Classification Search
CPC .............. G03F 7/70766; G03F 7/70725; G03F 7/70758; G03F 7/70775

USPC ...................... 355/72, 75; 318/609
See application file for complete search history.

(56) References Cited

U.S. PATENT DOCUMENTS

| | | | |
|---|---|---|---|
| 6,597,435 B2 | 7/2003 | Poon et al. | |
| 6,741,332 B2* | 5/2004 | Nishi | 355/72 |
| 2001/0050341 A1* | 12/2001 | Kwan | G03F 7/70716 250/491.1 |
| 2003/0197845 A1* | 10/2003 | Morisada | 355/53 |
| 2006/0241873 A1* | 10/2006 | Hsin et al. | 702/41 |

* cited by examiner

*Primary Examiner* — Peter B Kim
(74) *Attorney, Agent, or Firm* — Klarquist Sparkman, LLP

(57) ABSTRACT

An exemplary stage assembly has movable stage mass and counter-mass. A stage motor is coupled to the stage mass and counter-mass such that stage-mass motion imparted by the stage motor causes a reactive motion of the counter-mass counter to the motion of the stage mass. At least one trim-motor is coupled to the counter-mass. A control system commands the trim-motor to regulate movement of the counter-mass in reaction to stage-mass motion. A PI feedback controller receives the following-error of the counter-mass and generates corresponding center-of-gravity (CG) force commands and trim-motor force commands to the trim-motor(s) to produce corrective counter-mass motion. A trim-motor force limiter receives trim-motor force commands and produces corresponding limited trim-motor force commands that are fed back as actual CG force commands to the feedback controller to modify integral terms of the feedback controller according to the limited trim-motor force commands.

24 Claims, 18 Drawing Sheets

US 9,529,353 B2

METHODS FOR LIMITING COUNTER-MASS TRIM-MOTOR FORCE AND STAGE ASSEMBLIES INCORPORATING SAME

CROSS-REFERENCE TO RELATED APPLICATION

This application claims priority to and the benefit of U.S. Provisional Patent Application No. 61/381,022, filed on Sep. 8, 2010, which is incorporated herein by reference in its entirety.

FIELD

This disclosure pertains to, inter alia, motorized stage assemblies and other object-positioning devices used in precision systems. For example, the disclosure encompasses stage assemblies for holding reticles, semiconductor wafers, and other lithographic substrates, and the like for moving these objects relative to an optical system. More specifically, the disclosure is directed to methods for limiting, in a stage assembly, the force produced by one or more counter-mass trim-motors to reduce force transmission by the trim-motors to the system base structure and ground while maintaining proper system operation.

BACKGROUND

In precision systems that perform operations on objects such as workpieces and the like, the object is placed on, held by, and moved as required by a stage assembly that produces controlled motion of the object relative to a tool, optical system, energy source, or other implement that performs the operation(s) on or relative to the object. Such motion can be achieved by any of various actuators. Linear motors have become favored for this purpose due to their wide range of motion, accuracy, precision, reliability, and simplicity, but other types of motors may also or alternatively be used, depending upon the particular stage assembly and the particular type of precision system. For example, planar motors are now being considered for use in stage assemblies used for holding large microlithographic substrates.

A well-known example of a precision system is a microlithography system used for fabricating microelectronic components, displays, microprocessors, RAM memories, and other devices. Some of the stage assemblies used in microlithography systems have very large movable masses. By Newton's Third Law of motion, motor force to produce acceleration or deceleration of the movable mass (principal mass) of the stage in a particular direction produces an equal-magnitude but opposite-direction reactionary force. To absorb these reactionary forces, conventional stage assemblies include counter-masses that move synchronously with (but in the opposite direction to) corresponding motion of the movable mass of the stage itself. I.e., a counter-mass (CM) in a stage assembly is used to absorb at least most of the reaction force produced by corresponding motion of the movable stage mass, thereby reducing transmission of components of the reaction forces to the stage assembly, to structure supporting the stage assembly, or to the floor supporting a precision system including the stage assembly.

A schematic diagram of a conventional stage assembly 100 is shown in FIG. 1. The stage assembly 100 includes a base frame 102, a counter-mass 104, and a movable stage mass 106. The counter-mass 104 is supported by air bearings 108 relative to the base frame 102 so as to allow the counter-mass to move in the x-y plane relative to the base frame 102 substantially without friction. Mounted to the surface of the counter-mass 104 is a stage motor 110 to which the movable stage mass 106 is mounted. Actuation of the stage motor 110 causes corresponding motion of the movable stage mass 106 relative to the counter-mass 104, accompanied by corresponding reaction motion of the counter-mass relative to the base frame 102. Coupled between the counter-mass 104 and the base frame 102 are counter-mass trim-motors 112a, 112b, 114. In the configurations shown, there are two x-direction trim-motors 112a, 112b and one y-direction trim motor 114. The y-direction trim-motor 114 controls the y-position of the counter-mass 104. The two x-direction trim motors 112a, 112b not only control the x-position and x-direction movement of the counter-mass 104, but also control yaw (denoted $\theta_z$ or $T_z$) of the counter-mass 104 relative to the base frame 102.

As suggested by FIG. 1, the counter-mass 104 in a stage assembly 100 can be massive, depending upon the corresponding movable stage mass 106 and depending upon the displacement of the counter-mass that can be accommodated relative to the corresponding displacement of the movable stage mass. For example, in some stage assemblies the counter-mass 104 is approximately 10× more massive than the movable stage mass 106. To ensure that movement of the counter-mass 104 is truly reactive to corresponding motion of the movable stage mass 106, the stage motor(s) 110 is mounted to the counter-mass. Thus, motion of the movable stage mass 106 in a particular direction causes corresponding motion of the counter-mass 104 in the opposite direction.

Since the stage motor(s) 110 is mounted to the counter-mass 104, the counter-mass usually has electrical wires, cables, and coolant tubes 116 connecting the counter-mass to components and assemblies located elsewhere in the precision system. As the movable stage mass 106 accelerates and decelerates during normal motion, the corresponding motion of the counter-mass 104 relative to the base frame 102 can cause the pendant wires, cables, and tubes 116 to move relative to the counter-mass, which disturbs the counter-mass and needs to be compensated by the trim-motors.

The trim-motors 112a, 112b, 114 control motion of the counter-mass 104. Since the trim-motors 112a, 112b, 114 are not intended to supply all the energy consumed in moving the counter-mass 104, they typically consume low power compared to the stage motor(s) (hence the name "trim" motor). Also, due to space and other limitations, trim-motors 112a, 112b, 114 are normally not located on the center of gravity (CG) of the stage assembly 100. For this reason, the forces exerted by the trim-motors 112a, 112b, 114 should be as low as possible for accomplishing their tasks so as to reduce transmission of vibrations and other forces elsewhere in the system and beyond.

Nevertheless, in certain situations a trim-motor 112a, 112b, 114 receives power in excess of its power rating, resulting in a "saturation" condition. A counter-mass 104 to which a saturated trim-motor is coupled tends to be unstable, which can be a source of instability elsewhere in the system.

SUMMARY

The issue of avoiding saturation of a trim-motor used for correcting a motion of a counter-mass is addressed by, inter alia, stage assemblies as disclosed herein, of which an embodiment comprises a movable stage mass, a movable counter-mass, and at least one trim-motor coupled to the counter-mass. The stage assembly can include a stage motor coupled to the stage mass and to the counter-mass such that motion of the stage mass imparted by the stage motor causes a reactive motion of the counter-mass counter to the motion of the stage mass. Alternatively, motion of the counter-mass can be achieved by a separate motor. A control system is operably connected to the stage motor and to the at least one trim-motor. The control system produces commands to the at least one trim-motor to regulate movement of the counter-mass in reaction to a motion of the stage mass. The control system comprises a PI feedback controller and phase lead filter that receives the following-error of the counter-mass and generates corresponding force commands such as, but not limited to, center-of-gravity (CG) force commands. The counter-mass CG force commands desirably are distributed to the at least one trim-motor with a force-distribution matrix to produce a corrective motion of the counter-mass. The control system further comprises a trim-motor force limiter coupled to receive the trim-motor force commands and configured to produce corresponding limited trim-motor force commands. The control system is further configured to feed back the limited trim-motor force commands, as actual CG force commands, to the feedback controller to modify integral terms of the feedback controller according to the limited trim-motor force commands.

In many embodiments the "movable stage mass" is the movable "principal mass" of the stage, and includes the member (e.g., moving platform) that holds an object such as a workpiece. The principal mass desirably is mounted to the stage motor, and the stage motor desirably is mounted to the counter-mass so that the counter-mass moves easily in reaction to motion of the principal mass The control system can be embodied in, by way of example, any of various hardware-based, computer-based, firmware-based, software-based controllers and processors. The control system can be programmed using another processor or by any known programming protocol.

In some embodiments the control system further comprises a force-actuation matrix operably coupled in a feedback loop from the trim-motor force limiter to the PI feedback controller. The force-actuation matrix converts actual trim-motor force commands to actual CG force commands input to the feedback controller.

Particularly if the stage mass is movable by the stage motor in an x-y plane defined by an x-axis and a y-axis, the at least one trim-motor comprises at least one trim-motor configured to move the counter-mass in an x-axis direction, and at least one trim-motor configured to move the counter-mass in a y-axis direction. For example, the at least one trim-motor configured to move the counter-mass in the x-axis direction can comprise first and second x-axis trim-motors. Hence, the feedback controller is configured to produce CG force commands for x-axis, y-axis, and $\theta_z$ motion directions of the counter-mass. The force-distribution matrix is configured to produce, from the x-axis, y-axis, and $\theta_z$ force commands, corresponding trim-motor force commands for the y-direction trim-motor and first and second x-axis trim-motors. The trim-motor commands for the first and second x-axis trim-motors comprise respective commands for adjusting yaw of the counter-mass. The actual x-axis direction, y-axis direction, and $\theta_z$ force commands desirably are fed back to the feedback controller.

Another aspect of this disclosure is directed to methods set forth in the context of a stage assembly including a movable stage mass, a counter-mass movable in reaction to motion of the stage mass, and at least one counter-mass trim-motor. The subject methods are for, by way of example, controlling motion of the at least one counter-mass trim-motor. The method comprises comparing an actual position of the counter-mass in a plane to a corresponding reference position in the plane to produce at least one following-error. From the at least one following-error, a feedback-controlled CG force command is prepared according to a transfer-function having at least one integral (I) term. The CG force command is converted to a corresponding trim-motor force command. A force limit is imposed on the trim-motor command, and the at least one trim-motor is driven according to the limited trim-motor command. An actual limited trim-motor force command is fed back as an actual CG force command, and the actual CG force command is compared with the corresponding feedback-controlled CG force command produced from the transfer function to produce a difference. The at least one integral term of the transfer function is modified according to the difference.

The subject methods are performed automatically and do not reduce the throughput of the precision system. Also, no additional components are required. Meanwhile, by limiting the force applied by the trim-motor(s), the precision system is operated (including motion of the stage) in a more stable manner than conventionally.

The foregoing and additional features and advantages of the subject methods will be more readily apparent from the following detailed description, which proceeds with reference to the accompanying drawings.

DETAILED DESCRIPTION

Figure 1:
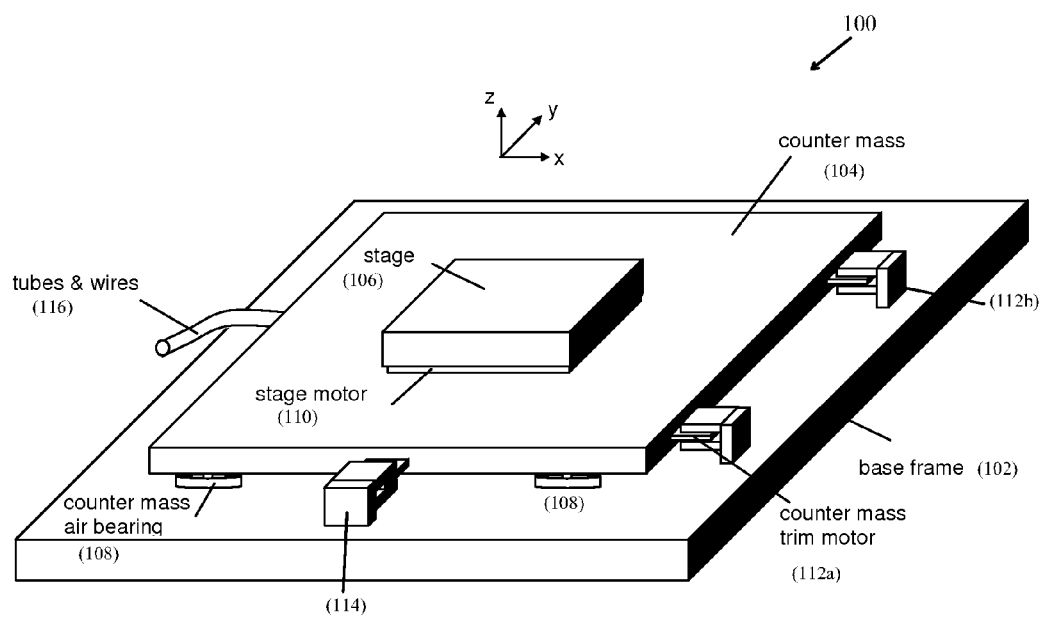
FIG. 1 is a schematic depiction of a stage including a counter-mass and trim-motors.

As used in this application and in the claims, the singular forms "a," "an," and "the" include the plural forms unless the context clearly dictates otherwise. Additionally, the term "includes" means "comprises." Further, the term "coupled" encompasses mechanical as well as other practical ways of coupling or linking items together, and does not exclude the presence of intermediate elements between the coupled items.

The described things and methods described herein should not be construed as being limiting in any way. Instead, this disclosure is directed toward all novel and non-obvious features and aspects of the various disclosed embodiments, alone and in various combinations and sub-combinations with one another. The disclosed things and methods are not limited to any specific aspect or feature or combinations thereof, nor do the disclosed things and methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and method. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In the following description, certain terms may be used such as "up," "down,", "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

This disclosure encompasses, inter alia, methods and devices for limiting the force produced by a counter-mass trim-motor to reduce possible transmission of forces to the stage assembly, to the base structure of the microlithography system, and/or to the floor beneath the precision system, while maintaining system operation within specifications. The methods balance the requirements of counter-mass servo performance with trim-motor force limitations while avoiding having to rearrange cables and wires leading to and from the stage system and its counter-masses. The subject methods may also allow the stage to run at higher speed and/or acceleration without having to increase the force capacity of the trim-motor.

It will be understood that a stage assembly incorporating features as disclosed herein is not limited to a stage assembly for a microlithography system. The stage assembly can be used on other precision systems such as high-accuracy machine tools, positioning systems, imaging systems, and the like. Also, the subject stage assemblies are not limited to those used for moving a lithographic substrate. Furthermore, the subject stage assemblies are not limited to those in which the movable stage mass is moved using a planar motor. Linear motors are widely used for this purpose, and other types of motors can be used as well.

Referring again to the stage assembly shown in FIG. 1, one trim-motor 114 is dedicated to y-direction control of counter-mass movement, and two trim-motors 112a, 112b are dedicated to x-direction control of counter-mass movement. Control of $\theta_z$($T_z$ or yaw) movement is achieved by cooperative action of the two x-direction trim-motors 112a, 112b. In other stage assemblies, two trim-motors may be used for controlling y-direction motion, while one trim-motor is used for controlling x-direction motion.

In either event, the trim-motors are not located on the center of gravity (CG) of the stage assembly. Hence, the counter-mass requires a certain control bandwidth to maintain its proper operation under the influence of disturbance forces due to cables and hoses that are connected to the counter-mass from the base frame. Meanwhile, the forces applied by trim-motor(s) moving the counter-mass should be as small as possible to reduce transmission of vibrations and other forces to the system and floor. These two design goals can conflict with each other whenever the movable stage mass moves at high acceleration, particularly at or near the end-limits of stage motion. Specifically, near the end-limits, reaction forces from stage motion tend to act on the counter-mass as an extra-large $\theta_z$ moment (yaw), which can cause saturation of the trim-motors. Without proper correction, this saturation problem can cause overall system instability.

Figure 2:
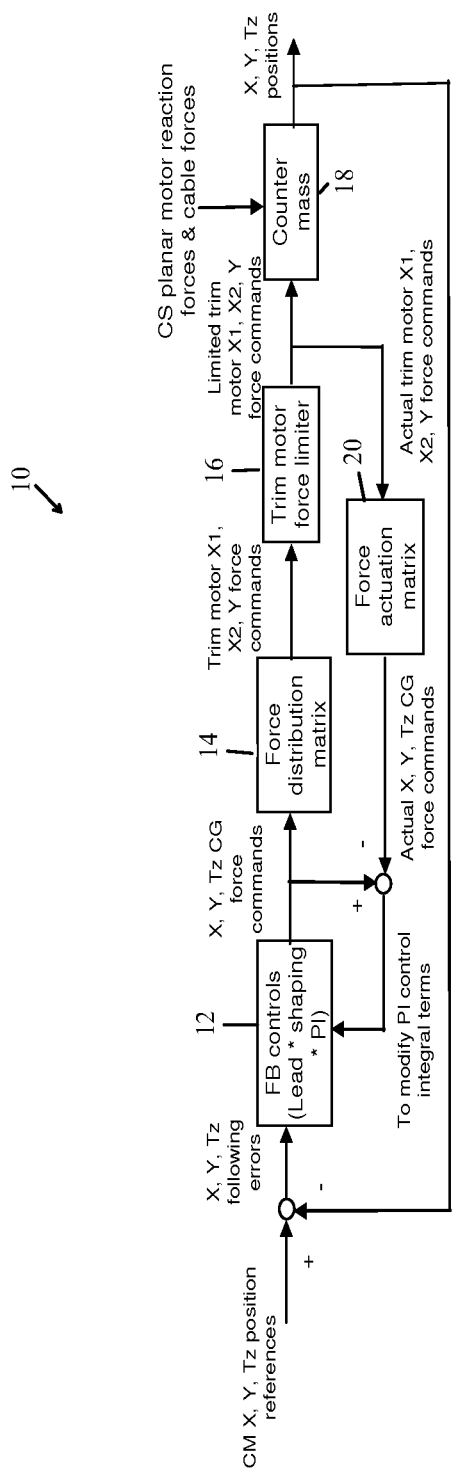
FIG. 2 is a control diagram of an embodiment of a counter-mass system comprising a trim-motor force limiter.

FIG. 2 is a control block diagram of an embodiment 10 of a counter-mass system comprising a trim-motor force limiter to limit actual trim-motor forces to within prescribed limits. The difference of original CG (center of gravity) force commands less actual values of the same (calculated from actual trim-motor force commands) are determined. This difference is used to correct the integral terms of the feedback controller in the CG feedback control to reflect the actual CG force command (with trim-motor force limiters). With this integral modification, the feedback control is performed more smoothly without excessive oscillations (as usually appears in a saturated system).

In FIG. 2, the CM (counter-mass) x, y, and $T_z(\theta_z$ or yaw) references of counter-mass (CM) position (left end of drawing) are obtained from system specifications. The CM position reference is approximated by the stage-position reference divided by a negative mass ratio of the CM versus the principal mass of the stage. The CM position reference is usually not precise due to other disturbances to the CM, such as from cables and hoses attached thereto.

Proceeding to the right in FIG. 2, x, y, and $T_z$ following-errors are determined from the corresponding references less actual x, y, and $T_z$ positions. The feedback-control block 12 incorporates feedback control (proportional and integral control with a phase lead filter) and generates x, y, and $T_z$ force commands for the center-of-gravity (CG) of the stage. The x, y, and $T_z$ CG force commands are converted by a force-distribution matrix 14 into corresponding trim-motor X1, X2, and Y force commands. To achieve force-limiting, the trim-motor X1, X2, and Y force commands are converted by a trim-motor force limiter 16 into corresponding limited trim-motor X1, X2, and Y force commands. These limited commands are applied to respective trim-motors that adjust the position of the counter-mass 18 accordingly, thereby producing actual x, y, and $T_z$ positions of the counter-mass. Meanwhile, the limited trim-motor X1, X2, and Y force commands are converted by a force-actuation matrix 20 into actual X, Y, and $T_z$ CG force commands that are compared to X, Y, $T_z$ CG force commands from the feedback controller 12. The result is fed back to the feedback controller 12 to correct the integral terms of the PI control.

In one embodiment the counter-mass trim-motor x forces are very close to the saturation limit whenever the stage x-position is close to ±80 mm. Application of force limitations (30 N) to the trim-motors may produce larger counter-mass following-errors, but without excessive change in the following-errors of the stage.

Reference is now made to FIGS. 3-10. For ready comparison, each figure presents data from two cases, "w/o limiter" and with a limiter imposing a "30N limit." It will be understood that a 30-N force limitation is not intended to be limiting in any way. Rather, it is exemplary of a force limitation advantageous to a stage assembly used in certain microlithography systems.

Figure 3A:
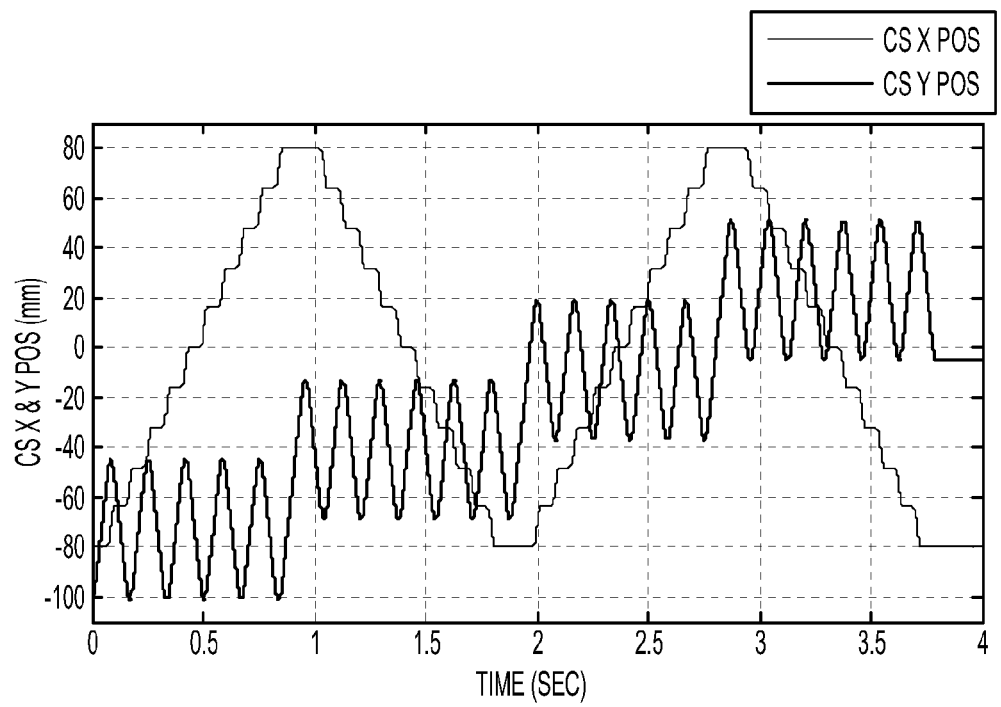
FIG. 3A is a plot of a series of 44 x-y trajectories of an exemplary stage made over a period of approximately 4 seconds, wherein the ordinate is position (mm) in the x and y directions, respectively.
Figure 3B:
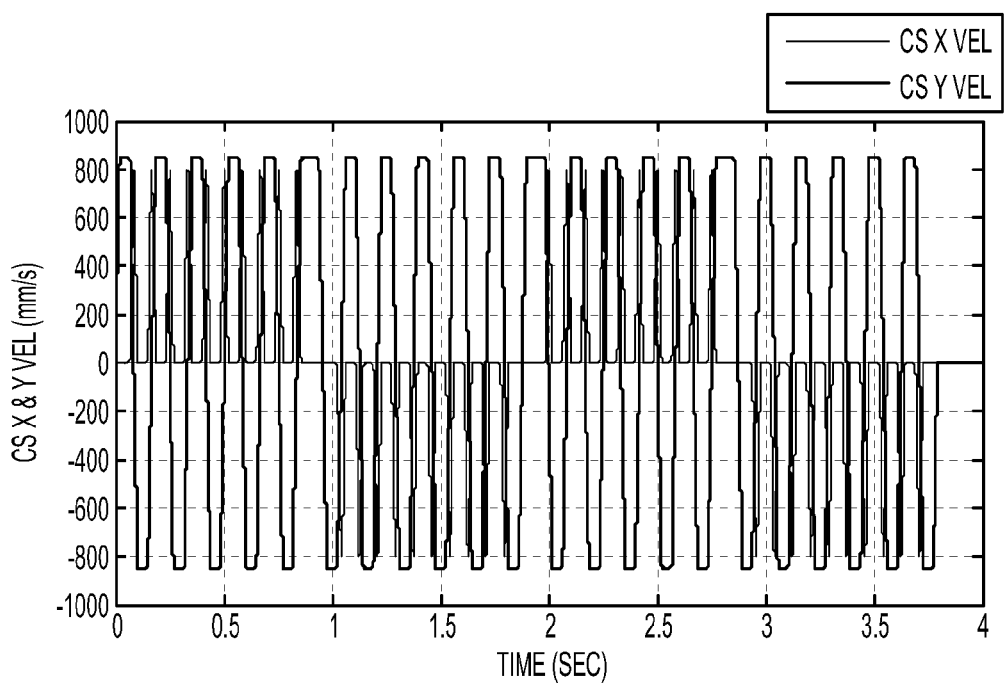
FIG. 3B is a plot of corresponding velocity achieved by the stage of FIG. 3A in each of the 44 trajectories, versus time, in the x and y directions, respectively.
Figure 3C:
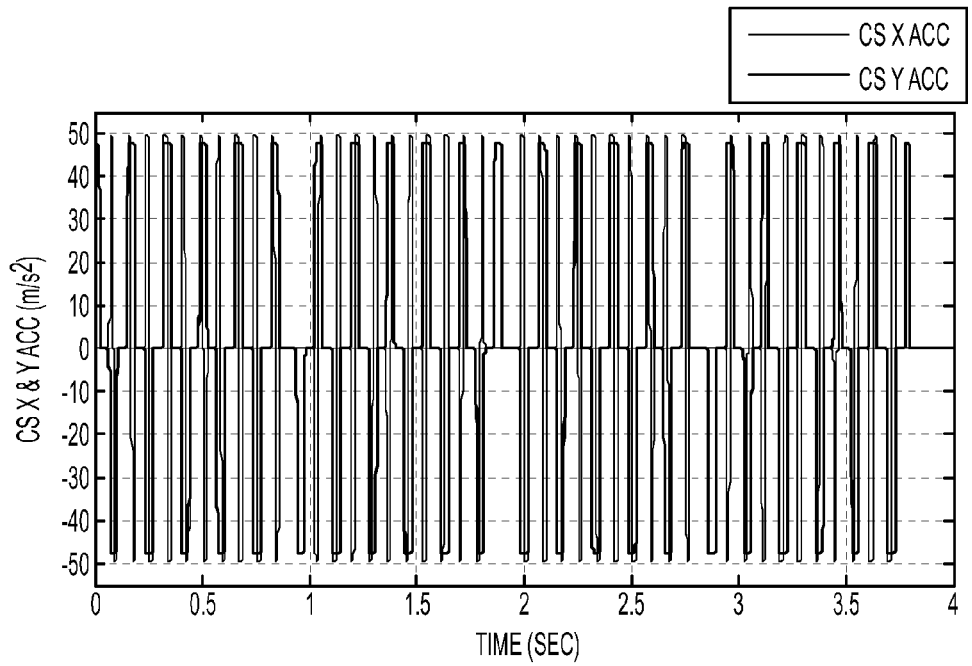
FIG. 3C is a plot of corresponding acceleration achieved by the stage of FIG. 3A in each of the 44 trajectories, versus time, in the x and y directions, respectively.

FIGS. 3A-3C present time-based data for a 44-shot sequence of a "coarse stage" (CS) in both the x and y directions. The x-direction movements are equivalent to "steps" performed by the wafer stage of a microlithography system, and the y-direction movements are equivalent to "scans" performed by the stage. The 44 shots are exemplary of positioning the stage for each of 44 exposures made on respective areas of the wafer. FIG. 3A shows plots of x and y position, FIG. 3B shows plots of x and y velocity, and FIG. 3B shows plots of x and y acceleration.

Figure 4A:
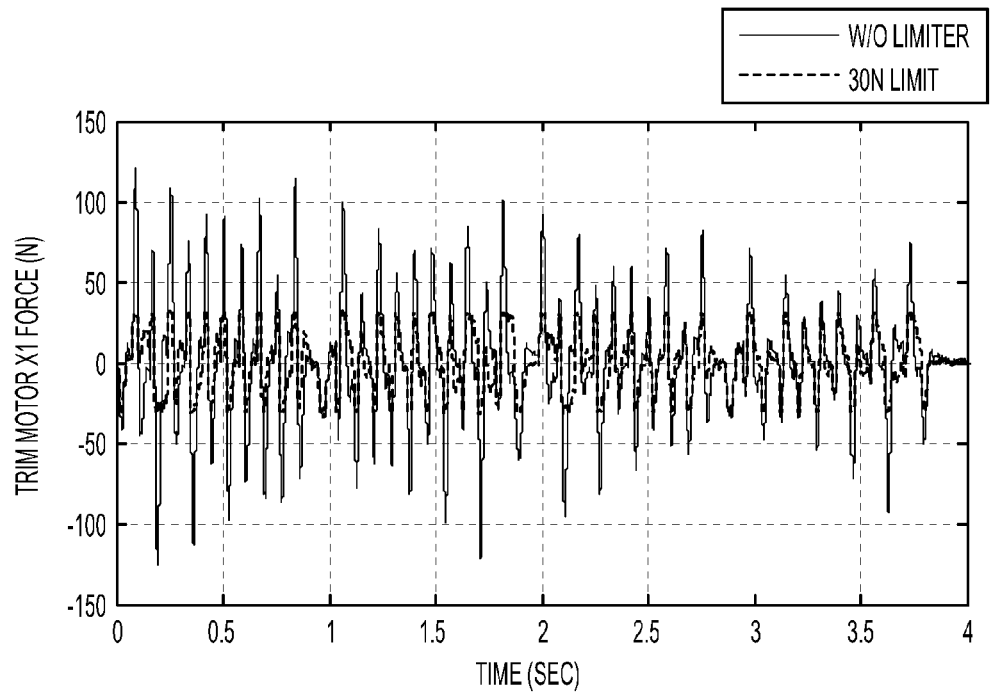
FIG. 4A is a plot of the force commands received by a first (X1) x-direction counter-mass trim-motor without a limiter and with a limiter imposing a 30-N limit, respectively, over the 44 trajectories of the stage.
Figure 4B:
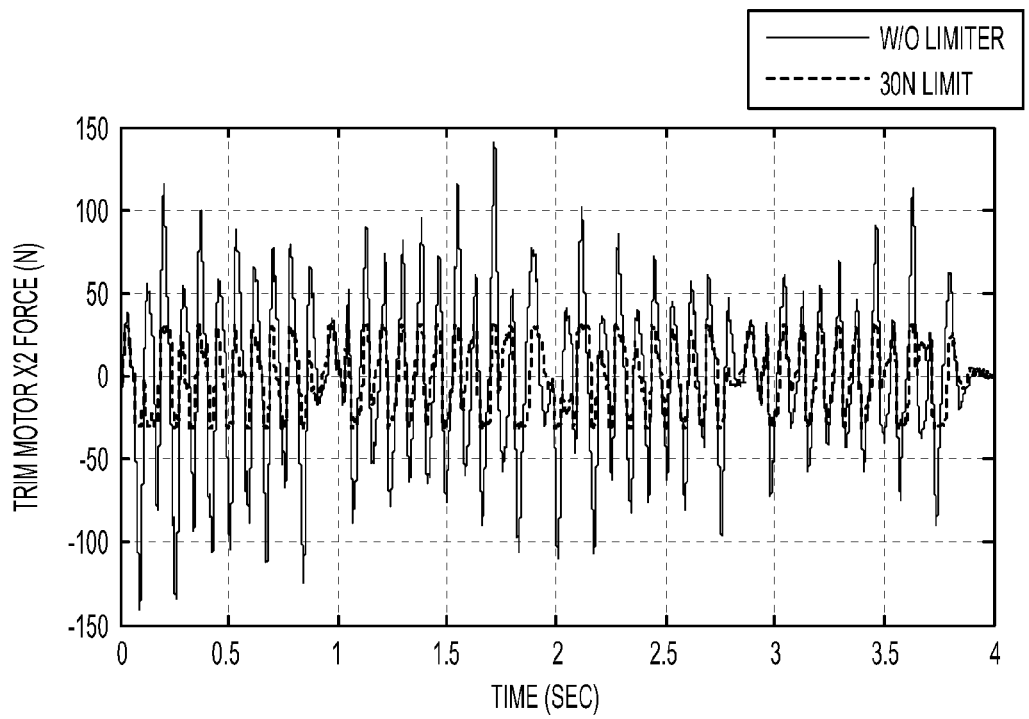
FIG. 4B is a plot of the force commands received by a second (X2) x-direction counter-mass trim-motor without a limiter and with a limiter imposing a 30-N limit, respectively, over the 44 trajectories of the stage.
Figure 4C:
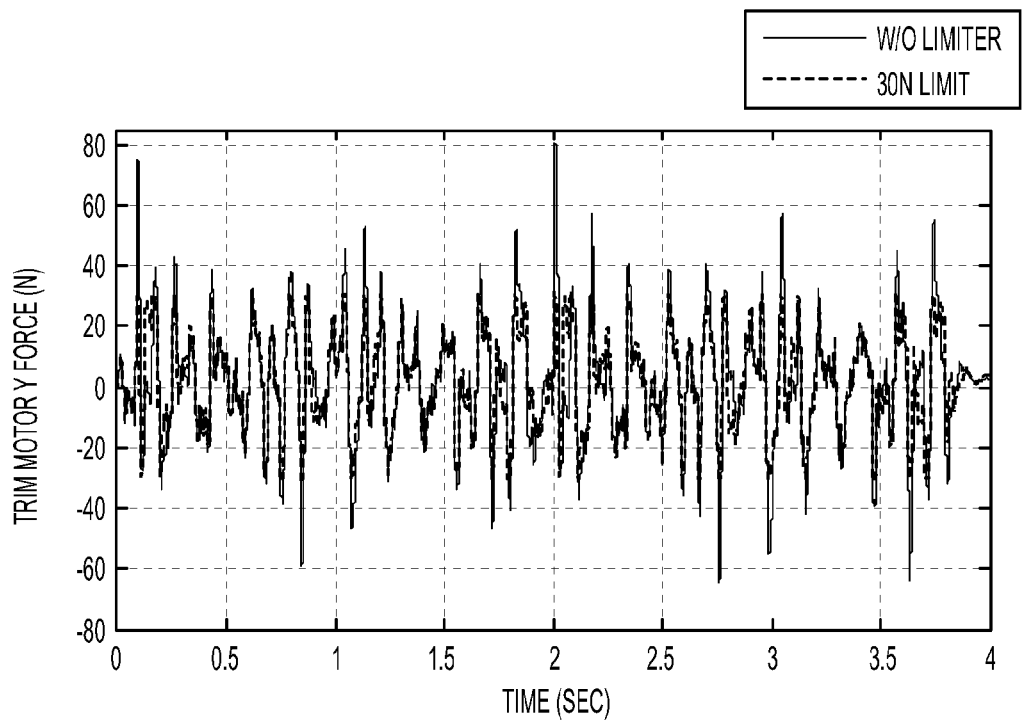
FIG. 4C is a plot of the force commands received by a y-direction counter-mass trim-motor without a limiter and with a limiter imposing a 30-N limit, respectively, over the 44 trajectories of the stage.

FIGS. 4A-4C present time-based data, for each of the 44 shots, of force produced by a first x-direction trim-motor (X1), force produced by a second x-direction trim-motor (X2), and force produced by a y-direction trim-motor (Y), respectively. The effect of the 30-N limitation in this embodiment is clearly evident.

Figure 5A:
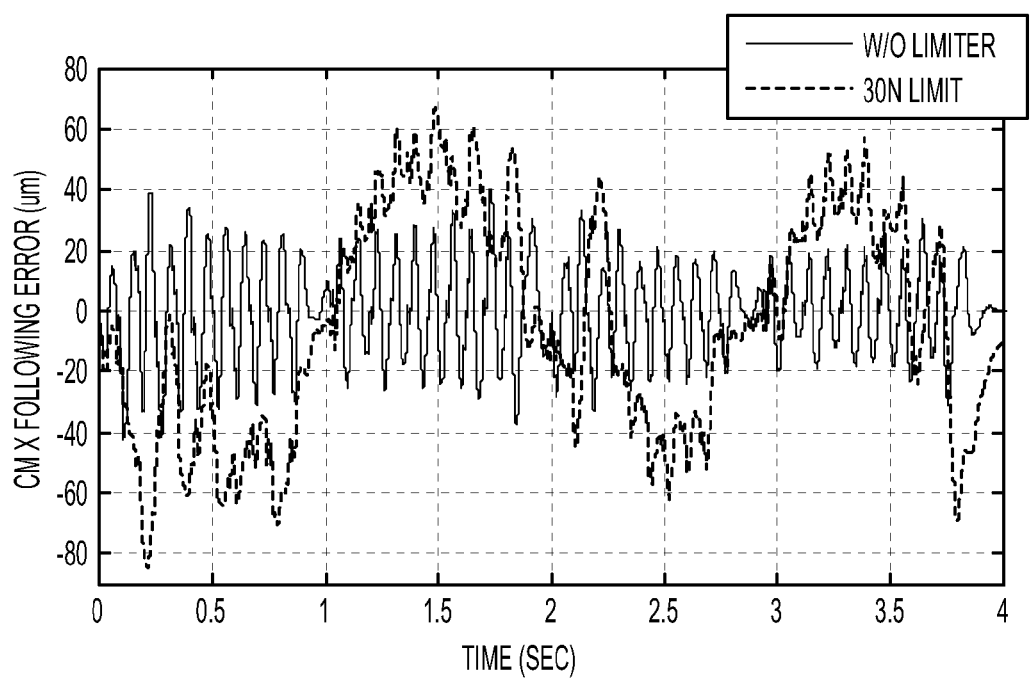
FIG. 5A is a plot of the counter-mass x-direction following-error exhibited by the stage without a limiter and with a limiter imposing a 30-N limit, respectively, over the 44 trajectories of the stage.
Figure 5B:
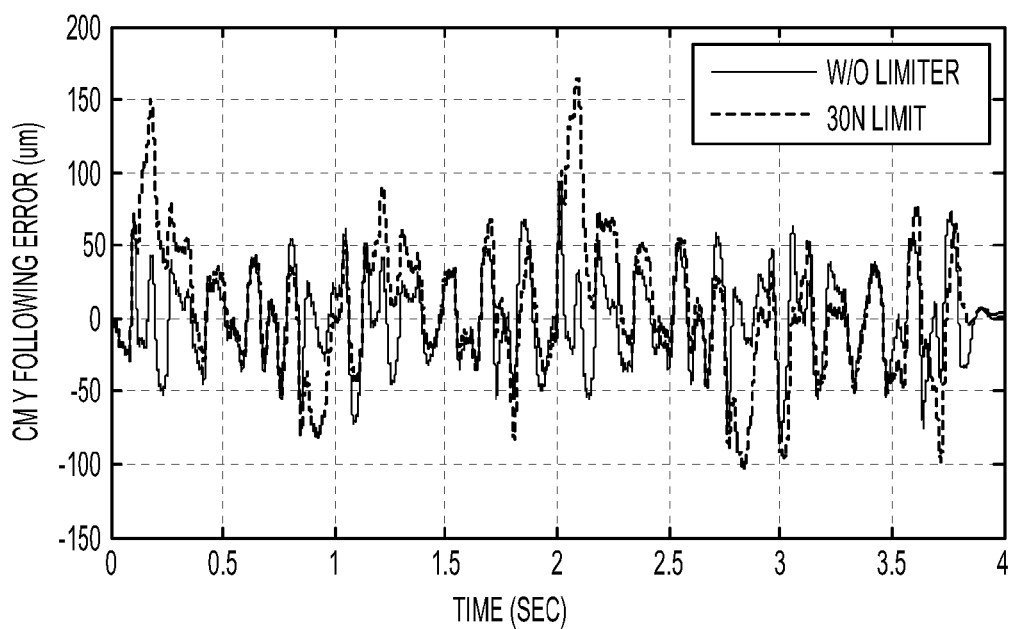
FIG. 5B is a plot of the counter-mass y-direction following-error exhibited by the stage without a limiter and with a limiter imposing a 30-N limit, respectively, over the 44 trajectories of the stage.
Figure 5C:
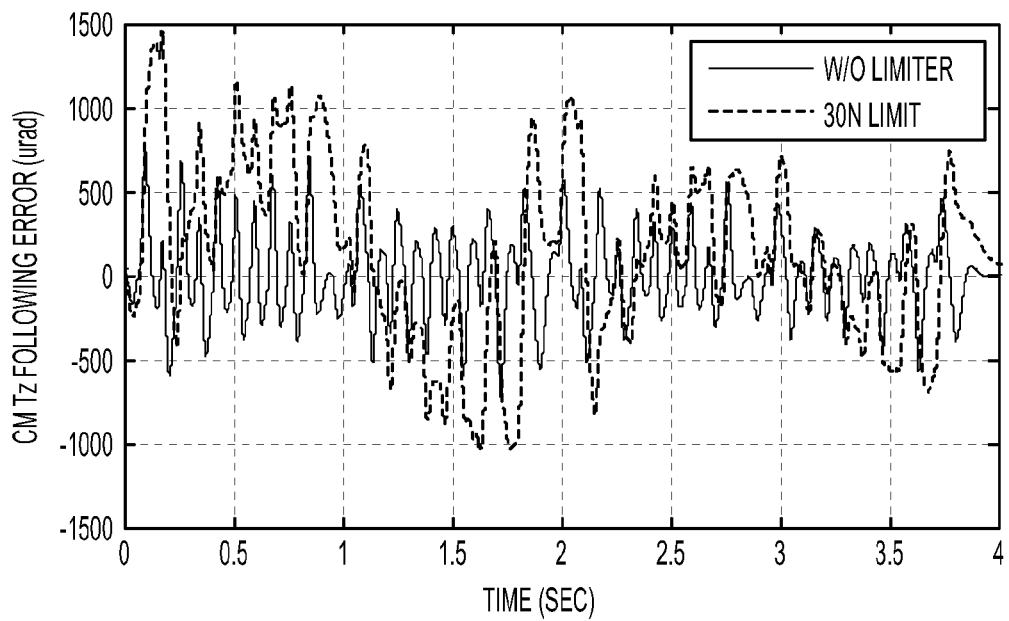
FIG. 5C is a plot of the counter-mass $\theta_z$ (yaw) following-error exhibited without a limiter and with a limiter imposing a 30-N limit, respectively, over the 44 trajectories of the stage.

FIGS. 5A-5C are plots of time-based data, for each of the 44 shots, of following-error exhibited by the counter-mass (CM). FIG. 5A is x-direction (X) following-error, FIG. 5B is y-direction (Y) following-error, and FIG. 5C is $T_z(\theta_z)$ following-error. As expected, force limitation produced larger following-errors than without force-limitation. However, this was deemed inconsequential because the trim-motors need not be excessively accurate anyway.

Figure 6A:
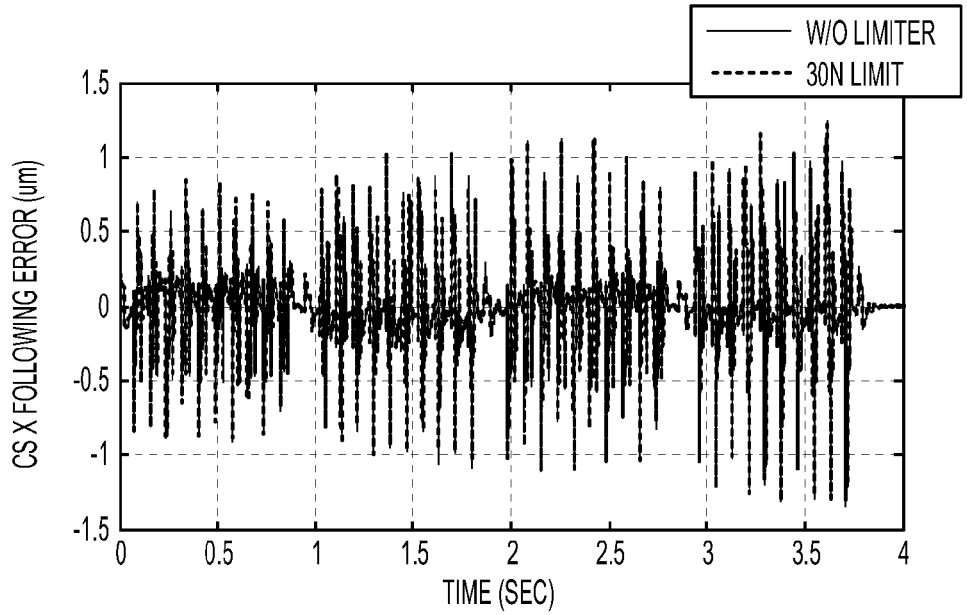
FIG. 6A is a plot of the center-stage x-direction following-error exhibited by the stage without a limiter and with a limiter imposing a 30-N limit, respectively, over the 44 trajectories of the stage.
Figure 6B:
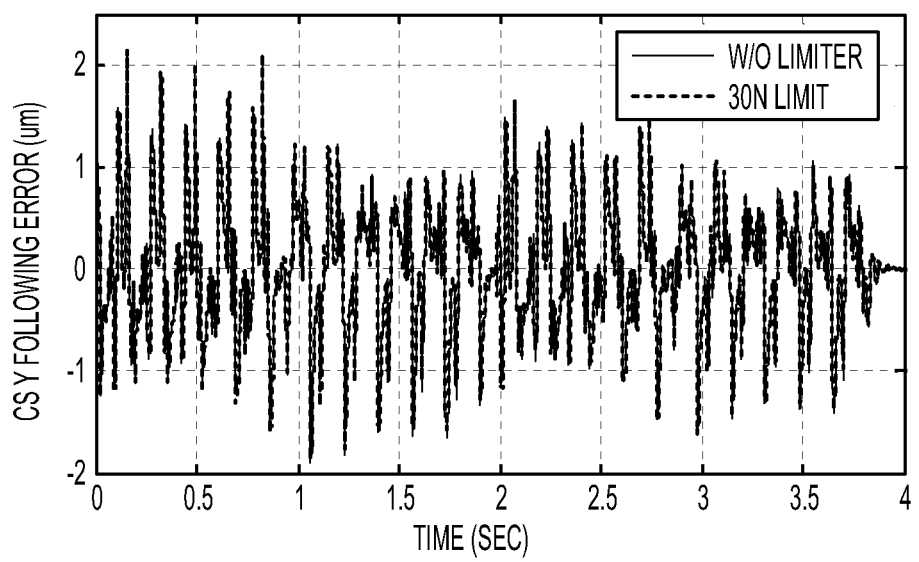
FIG. 6B is a plot of the center-stage y-direction following-error exhibited by the stage without a limiter and with a limiter imposing a 30-N limit, respectively, over the 44 trajectories of the stage.
Figure 6C:
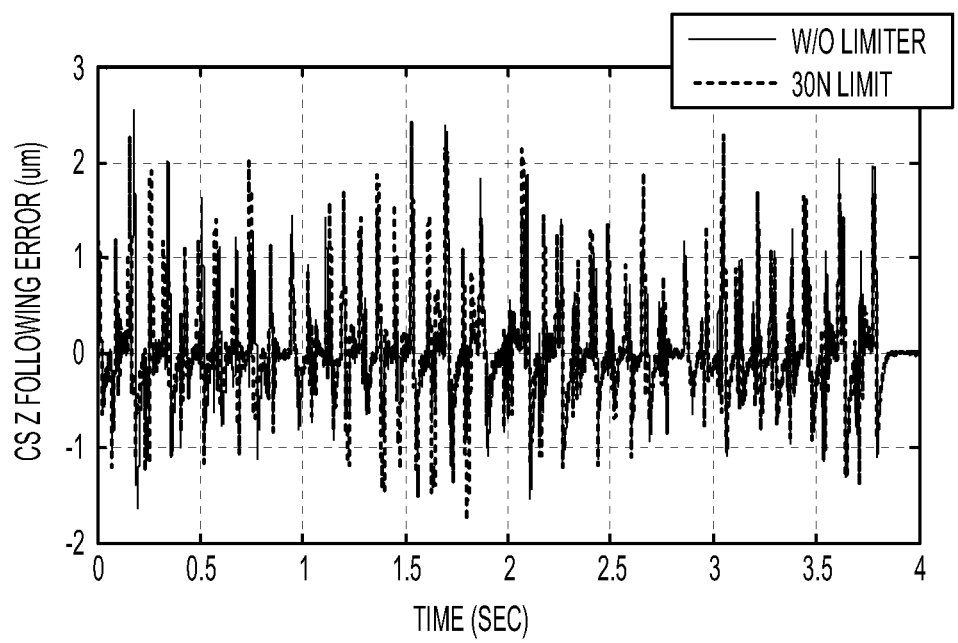
FIG. 6C is a plot of the center-stage $\theta_z$ following-error exhibited by the stage without a limiter and with a limiter imposing a 30-N limit, respectively, over the 44 trajectories of the stage.

FIGS. 6A-6C are plots of time-based data, for each of the 44 shots, of following-error exhibited by the stage. FIG. 6A is x-direction (X) following-error, FIG. 6B is y-direction (Y) following-error, and FIG. 6C is $T_z(\theta_z)$ following-error. The data did not exhibit any substantial change in stage following-error accompanying force limitation versus no limitation.

Figure 7A:
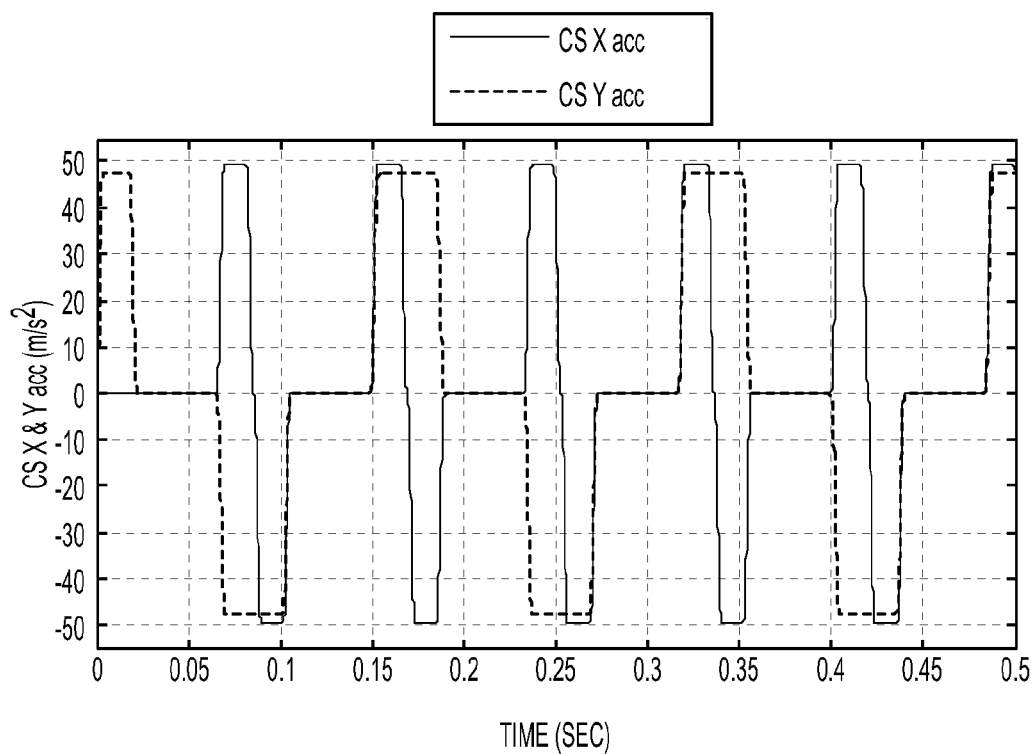
FIG. 7A is a "magnified" plot, over the first six trajectories, of the stage x- and y-direction acceleration, respectively.
Figure 7B:
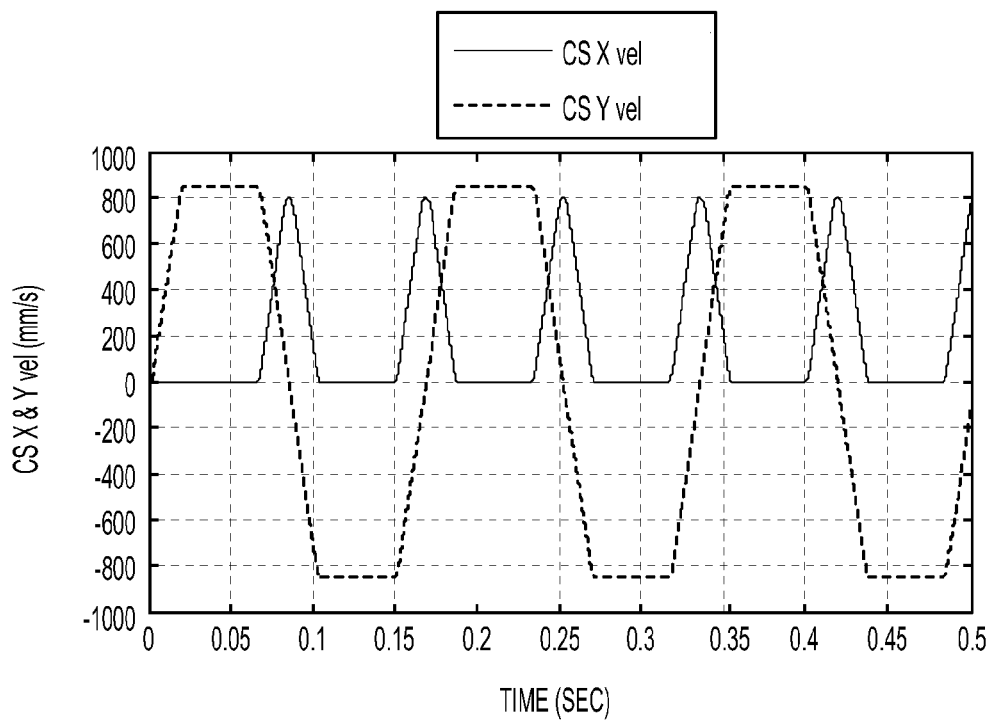
FIG. 7B is a "magnified" plot, over the first six trajectories, of the stage x- and y-direction velocity, respectively.
Figure 7C:
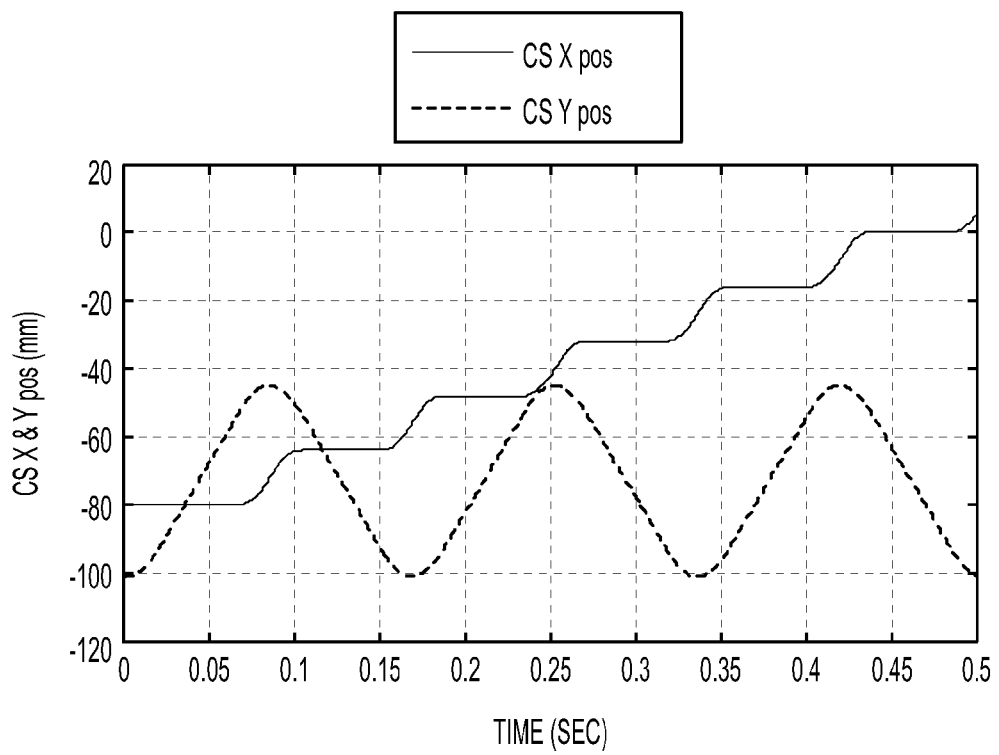
FIG. 7C is a "magnified" plot, over the first six trajectories, of the stage x- and y-direction position, respectively.

FIGS. 7A-7C are similar to FIGS. 3A-3C, except that FIGS. 7A-7C present time-based data for the first six shots of the 44 shots. FIGS. 7A-7C allow more detail to be revealed compared to the crowded plots in FIGS. 3A-3C.

Figure 8A:
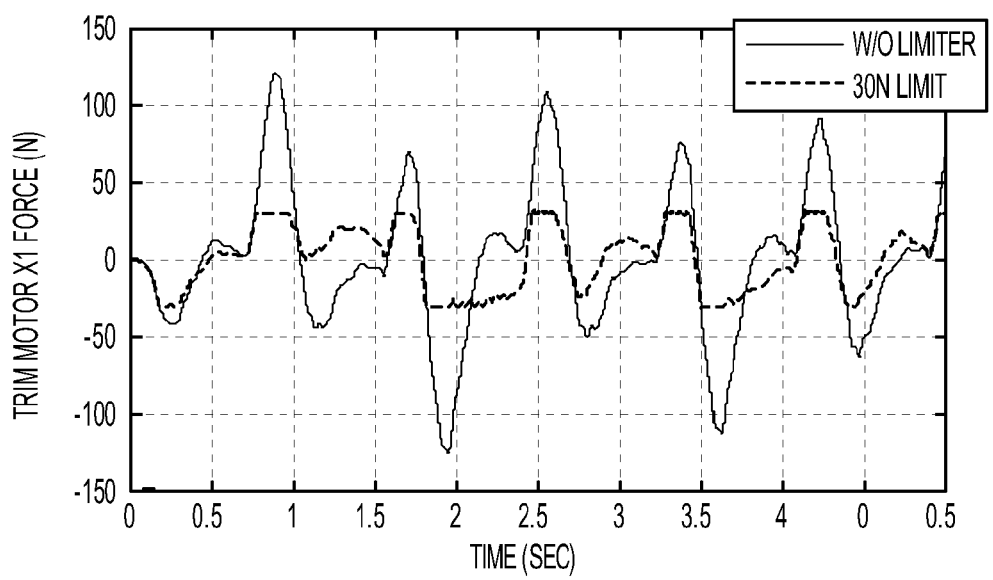
FIG. 8A is a "magnified" plot, over the first six trajectories, of the force commands received by a first (X1) x-direction counter-mass trim-motor without a limiter and with a limiter imposing a 30-N limit, respectively.
Figure 8B:
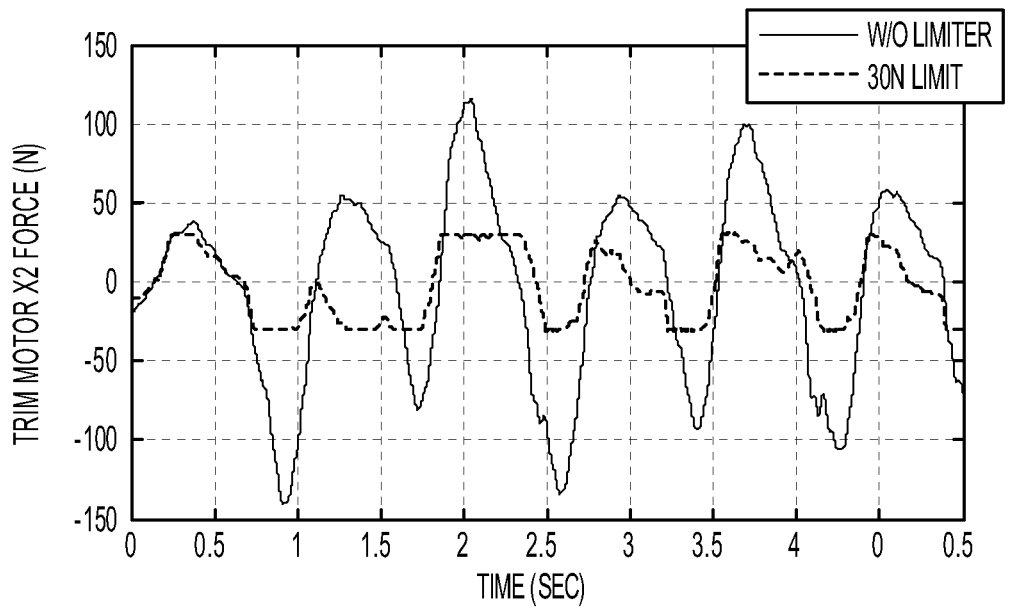
FIG. 8B is a "magnified" plot, over the first six trajectories, of the force commands received by a second (X2) x-direction counter-mass trim-motor without a limiter and with a limiter imposing a 30-N limit, respectively.
Figure 8C:
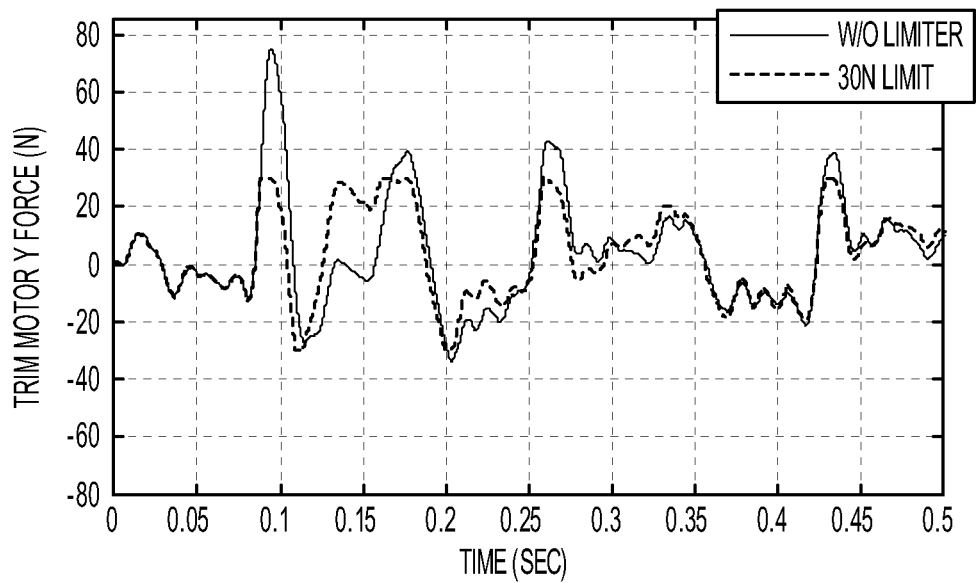
FIG. 8C is a "magnified" plot, over the first six trajectories, of the force commands received by a counter-mass y-direction trim-motor without a limiter and with a limiter imposing a 30-N limit, respectively.

FIGS. 8A-8C are similar to FIGS. 4A-4C, except that FIGS. 8A-8C present time-based data for the first six shots of the 44 shots. FIGS. 8A-8C allow more detail to be revealed compared to the crowded plots in FIGS. 4A-4C.

Figure 9A:
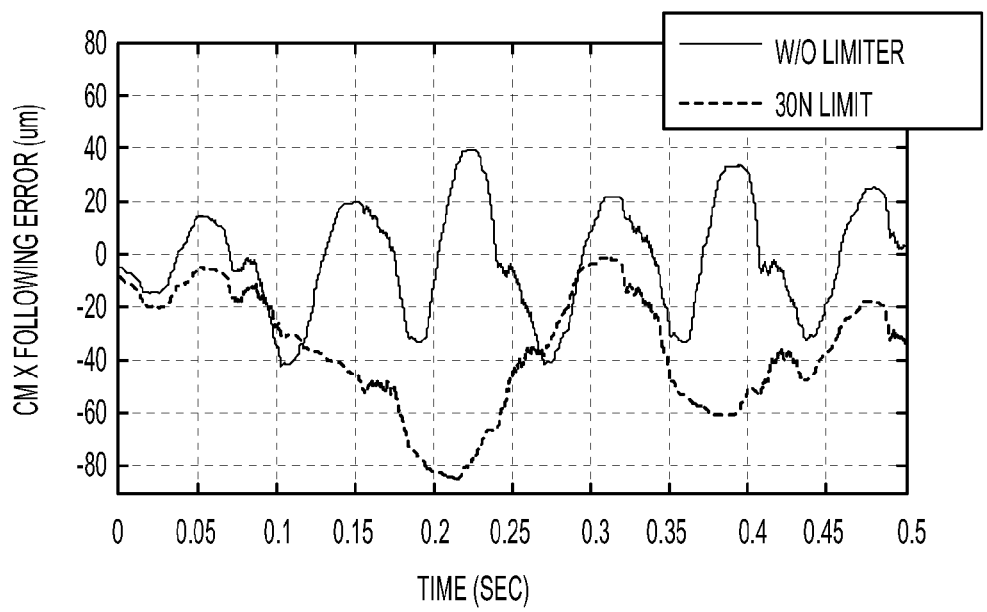
FIG. 9A is a "magnified" plot, over the first six trajectories, of the counter-mass x-direction following-error without a limiter and with a limiter imposing a 30-N limit, respectively.
Figure 9B:
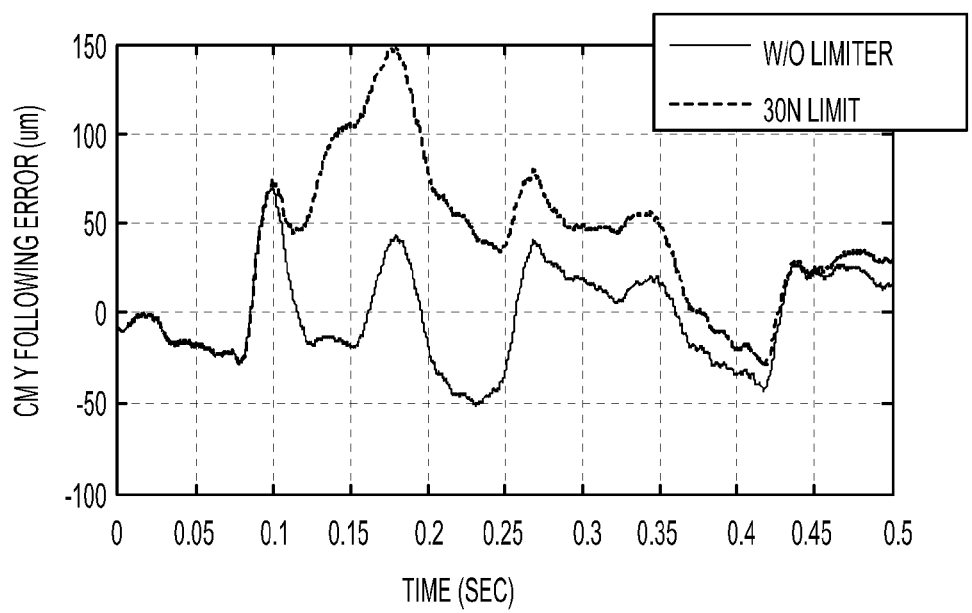
FIG. 9B is a "magnified" plot, over the first six trajectories, of the counter-mass y-direction following-error without a limiter and with a limiter imposing a 30-N limit, respectively.
Figure 9C:
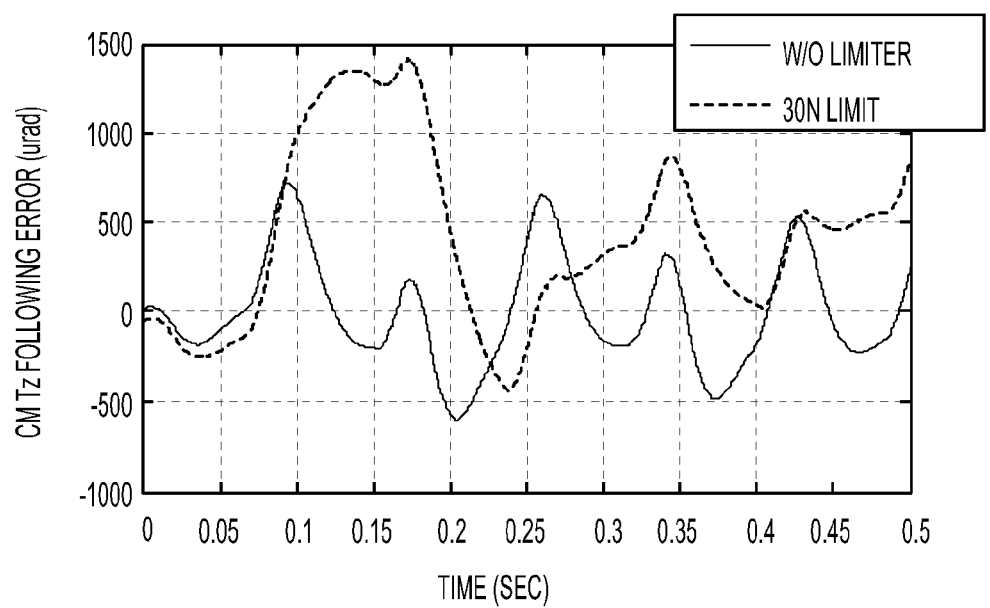
FIG. 9C is a "magnified" plot, over the first six trajectories, of the counter-mass yaw (denoted $\theta_z$ or $T_z$) following-error without a limiter and with a limiter imposing a 30-N limit, respectively.

FIGS. 9A-9C are similar to FIGS. 5A-5C, except that FIGS. 9A-9C present time-based data for the first six shots of the 44 shots. FIGS. 9A-9C allow more detail to be revealed compared to the crowded plots in FIGS. 5A-5C.

Figure 10A:
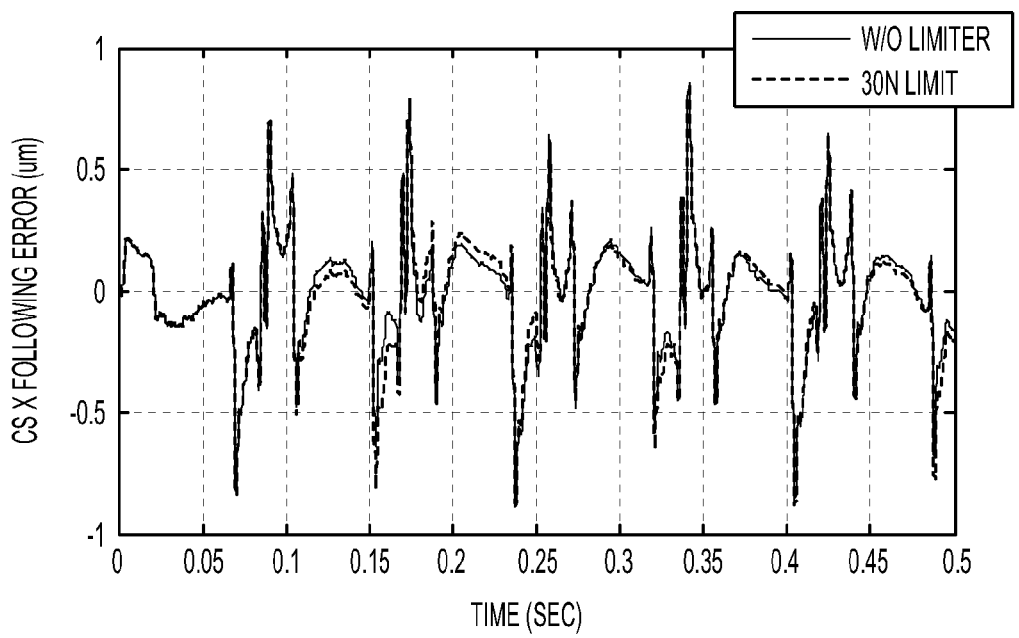
FIG. 10A is a "magnified" plot, over the first six trajectories, of the center-stage x-direction following-error exhibited by the stage without a limiter and with a limiter imposing a 30-N limit, respectively.
Figure 10B:
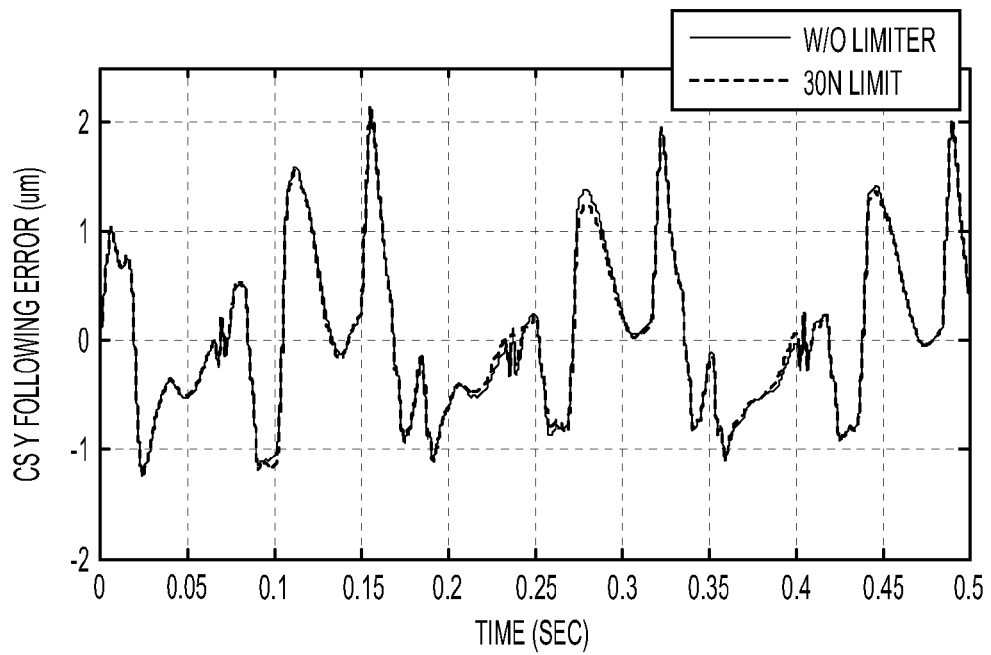
FIG. 10B is a "magnified" plot, over the first six trajectories, of the center-stage y-direction following-error exhibited by the stage without a limiter and with a limiter imposing a 30-N limit, respectively.
Figure 10C:
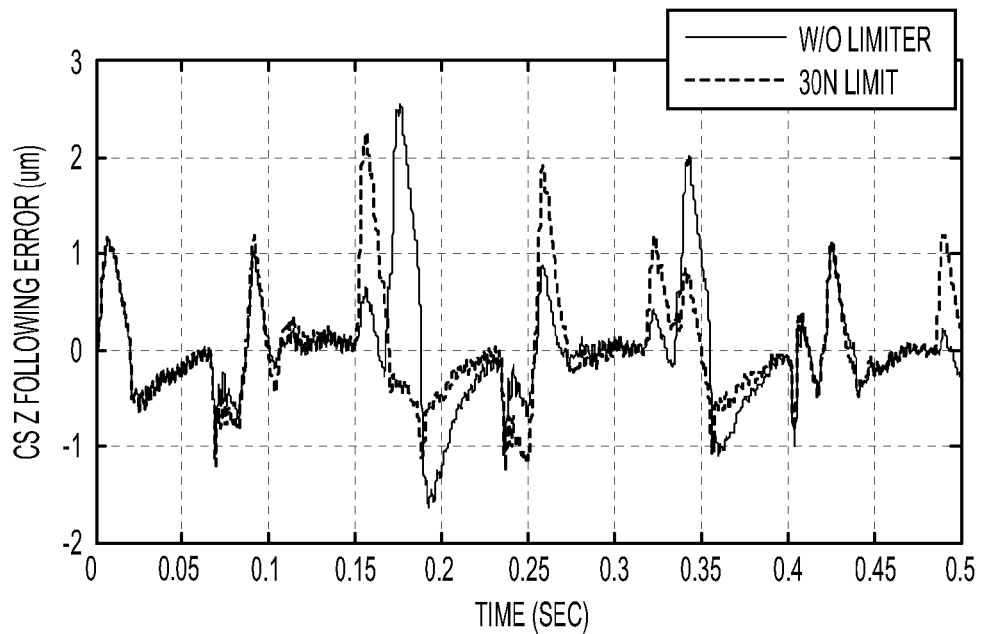
FIG. 10C is a "magnified" plot, over the first six trajectories, of the center-stage z-direction following-error exhibited by the stage without a limiter and with a limiter imposing a 30-N limit, respectively.

FIGS. 10A-10C are similar to FIGS. 6A-6C, except that FIGS. 10A-10C present time-based data for the first six shots of the 44 shots. FIGS. 10A-10C allow more detail to be revealed compared to the crowded plots in FIGS. 6A-6C.

An example of a precision system comprising at least one stage in which the trim-motors are force-limited as described above is an immersion microlithography system.

Figure 11:
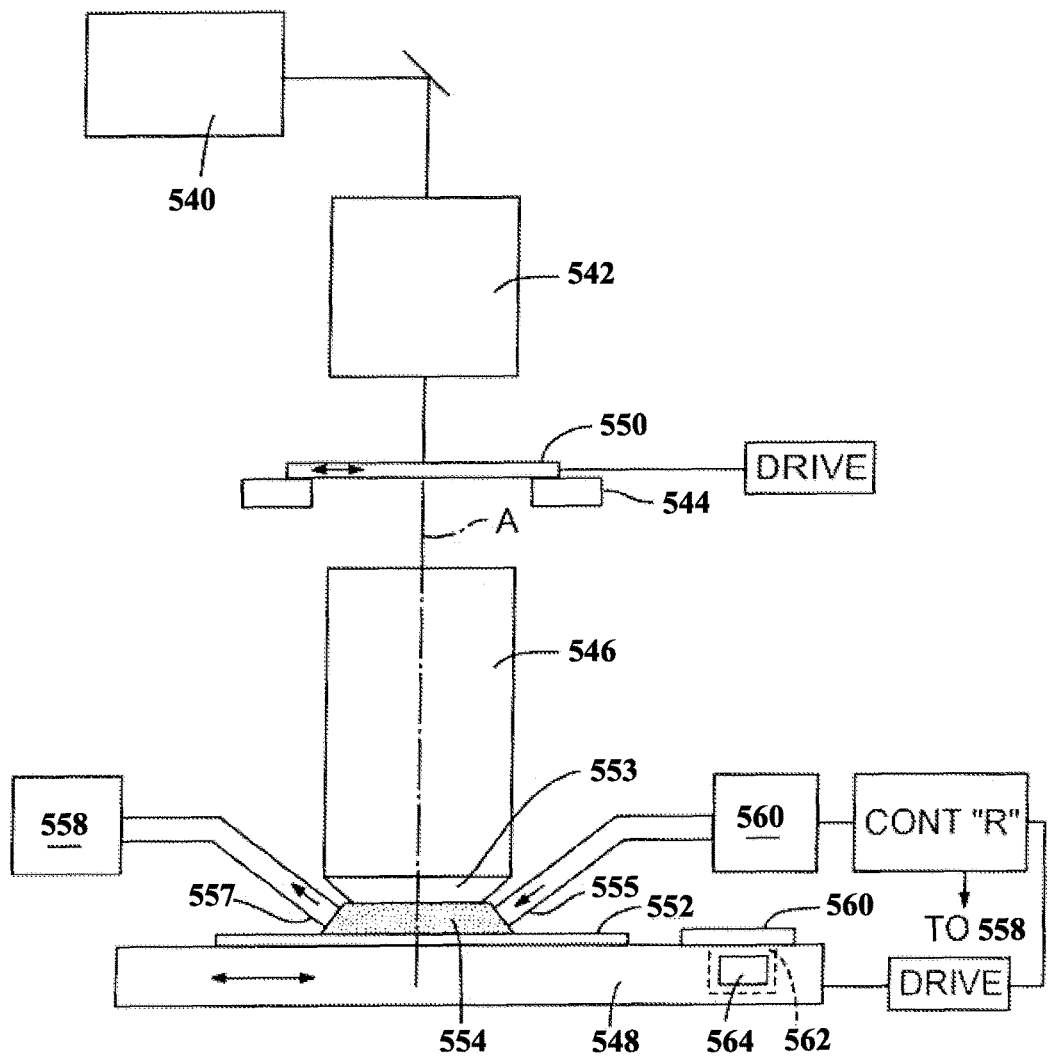
FIG. 11 is a schematic diagram of an immersion microlithography system, which is a first example of a precision system including a stage assembly as described herein.

Turning now to FIG. 11, certain features of an immersion lithography system are shown, namely, a light source 540, an illumination-optical system 542, a reticle stage 544, a projection-optical system 546, and a wafer (substrate) stage 548, all arranged along an optical axis A. The light source 540 is configured to produce a pulsed beam of illumination light, such as DUV light of 248 nm as produced by a KrF excimer laser, DUV light of 193 nm as produced by an ArF excimer laser, or DUV light of 157 nm as produced by an $F_2$ excimer laser. The illumination-optical system 542 includes an optical integrator and at least one lens that conditions and shapes the illumination beam for illumination of a specified region on a patterned reticle 550 mounted to the reticle stage 544. The pattern as defined on the reticle 550 corresponds to the pattern to be transferred lithographically to a wafer 552 that is held on the wafer stage 548. Lithographic transfer in this system is by projection of an aerial image of the pattern from the reticle 550 to the wafer 552 using the projection-optical system 546. The projection-optical system 546 typically comprises many individual optical elements (not detailed) that project the image at a specified demagnification ratio (e.g., ¼ or ⅕) on the wafer 552. So as to be imprintable, the wafer surface is coated with a layer of a suitable exposure-sensitive material termed a "resist."

The reticle stage 544 is configured to move the reticle 550 in the x-direction, y-direction, and rotationally about the z-axis (yaw). To such end, the reticle stage is equipped with one or more linear motors having cooled coils as described herein. The two-dimensional position and orientation of the reticle 550 on the reticle stage 544 are detected by a laser interferometer (not shown) in real time, and positioning of the reticle 550 is effected by a main control unit on the basis of the detection thus made.

The wafer 552 is held by a wafer holder ("chuck," not shown) on the wafer stage 548. The wafer stage 548 includes a mechanism (not shown) for controlling and adjusting, as required, the focusing position (along the z-axis) and the tilting angle of the wafer 552. The wafer stage 548 also includes electromagnetic actuators (e.g., linear motors or a planar motor, or both) for moving the wafer in the x-y plane substantially parallel to the image-formation surface of the projection-optical system 546. These actuators desirably comprise linear motors, one more planar motors, or both.

The wafer stage 548 also includes mechanisms for adjusting the tilting angle of the wafer 552 by an auto-focusing and auto-leveling method. Thus, the wafer stage serves to align the wafer surface with the image surface of the projection-optical system. The two-dimensional position and orientation of the wafer are monitored in real time by another laser interferometer (not shown). Control data based on the results of this monitoring are transmitted from the main control unit to a drive circuits for driving the wafer stage. During exposure, the light passing through the projection-optical system is made to move in a sequential manner from one location to another on the wafer, according to the pattern on the reticle in a step-and-repeat or step-and-scan manner.

The projection-optical system 546 normally comprises many lens elements that work cooperatively to form the exposure image on the resist-coated surface of the wafer 552. For convenience, the most distal optical element (i.e., closest to the wafer surface) is an objective lens 553. Since the depicted system is an immersion lithography system, it includes an immersion liquid 554 situated between the objective lens 553 and the surface of the wafer 552. As discussed above, the immersion liquid 554 is of a specified type. The immersion liquid is present at least while the pattern image of the reticle is being exposed onto the wafer.

The immersion liquid 554 is provided from a liquid-supply unit 556 that may comprise a tank, a pump, and a temperature regulator (not individually shown). The liquid 554 is gently discharged by a nozzle mechanism 555 into the gap between the objective lens 553 and the wafer surface. A liquid-recovery system 558 includes a recovery nozzle 57 that removes liquid from the gap as the supply 56 provides fresh liquid 554. As a result, a substantially constant volume of continuously replaced immersion liquid 554 is provided between the objective lens 553 and the wafer surface. The temperature of the liquid is regulated to be approximately the same as the temperature inside the chamber in which the lithography system itself is disposed.

Also shown is a sensor window 560 extending across a recess 562, defined in the wafer stage 548, in which a sensor 564 is located. Thus, the window 560 sequesters the sensor 564 in the recess 562. Movement of the wafer stage 548 so as to place the window 560 beneath the objective lens 553, with continuous replacement of the immersion fluid 554, allows a beam passing through the projection-optical system 546 to transmit through the immersion fluid and the window 560 to the sensor 564.

Figure 12:
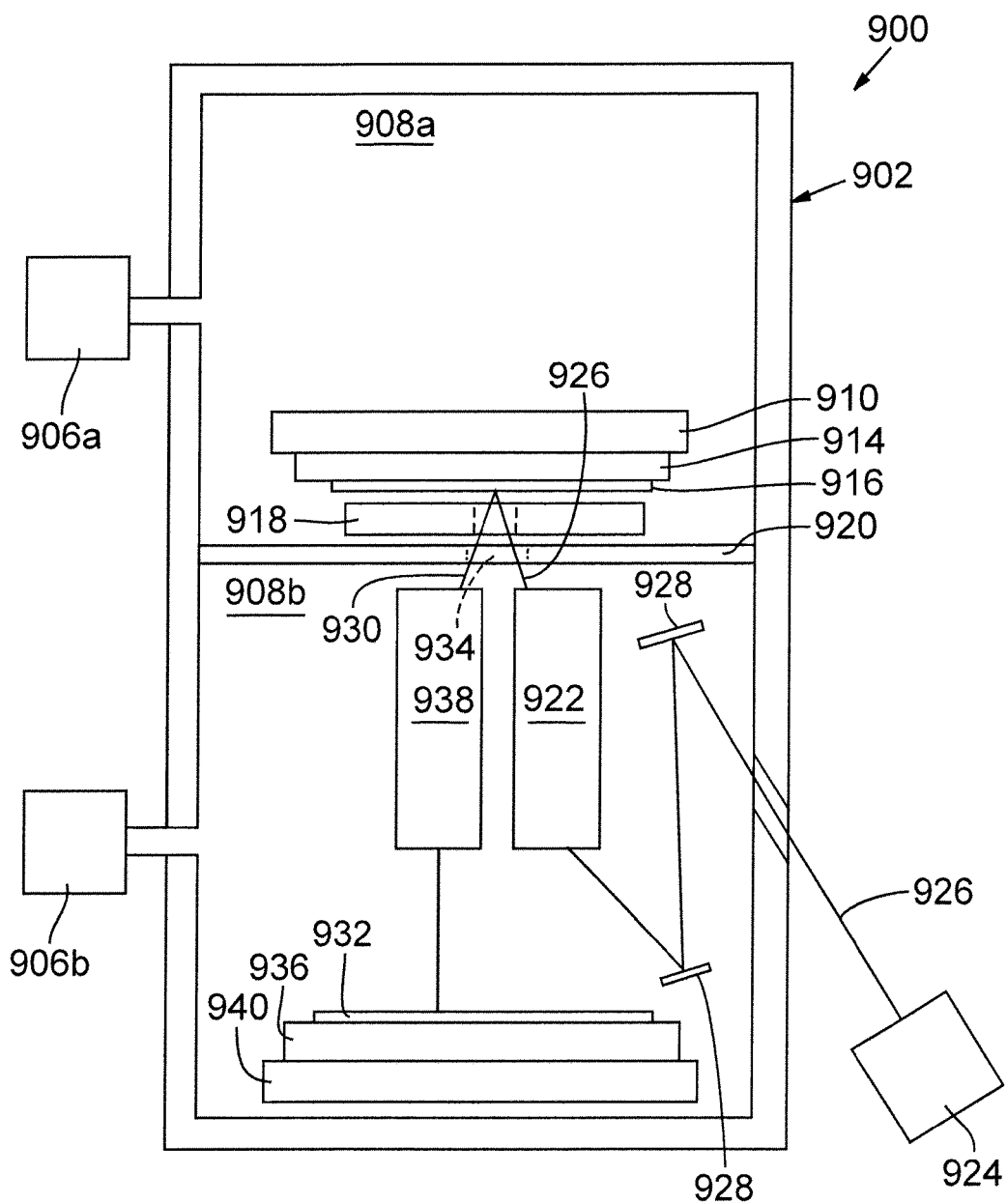
FIG. 12 is a schematic diagram of an extreme-UV microlithography system, which is a second example of a precision system including a stage assembly as described herein.

Referring now to FIG. 12, an alternative embodiment of a precision system that can include one or more electromagnetic actuators having actively cooled coils as described herein is an EUVL system 900, as a representative precision system incorporating an electromagnetic actuator as described herein, is shown. The depicted system 900 comprises a vacuum chamber 902 including vacuum pumps 906a, 906b that are arranged to enable desired vacuum levels to be established and maintained within respective chambers 908a, 908b of the vacuum chamber 902. For example, the vacuum pump 906a maintains a vacuum level of approximately 50 mTorr in the upper chamber (reticle chamber) 908a, and the vacuum pump 906b maintains a vacuum level of less than approximately 1 mTorr in the lower chamber (optical chamber) 908b. The two chambers 908a, 908b are separated from each other by a barrier wall 920. Various components of the EUVL system 900 are not shown, for ease of discussion, although it will be appreciated that the EUVL system 900 can include components such as a reaction frame, a vibration-isolation mechanism, various actuators, and various controllers.

An EUV reticle 916 is held by a reticle chuck 914 coupled to a reticle stage 910. The reticle stage 910 holds the reticle 916 and allows the reticle to be moved laterally in a scanning manner, for example, during use of the reticle for making lithographic exposures. Between the reticle 916 and the barrier wall 920 is a blind apparatus. An illumination source 924 produces an EUV illumination beam 926 that enters the optical chamber 908b and reflects from one or more mirrors 928 and through an illumination-optical system 922 to illuminate a desired location on the reticle 916. As the illumination beam 926 reflects from the reticle 916, the beam is "patterned" by the pattern portion actually being illuminated on the reticle. The barrier wall 920 serves as a differential-pressure barrier and can serve as a reticle shield that protects the reticle 916 from particulate contamination during use. The barrier wall 920 defines an aperture 934 through which the illumination beam 926 may illuminate the desired region of the reticle 916. The incident illumination beam 926 on the reticle 916 becomes patterned by interaction with pattern-defining elements on the reticle, and the resulting patterned beam 930 propagates generally downward through a projection-optical system 938 onto the surface of a wafer 932 held by a wafer chuck 936 on a wafer stage 940 that performs scanning motions of the wafer during exposure. Hence, images of the reticle pattern are projected onto the wafer 932.

The wafer stage 940 can include (not detailed) a positioning stage that may be driven by a planar motor or one or more linear motors, for example, and a wafer table that is magnetically coupled to the positioning stage using an EI-core actuator, for example. The wafer chuck 936 is coupled to the wafer table, and may be levitated relative to the wafer table by one or more voice-coil motors, for example. If the positioning stage is driven by a planar motor, the planar motor typically utilizes respective electromagnetic forces generated by magnets and corresponding armature coils arranged in two dimensions. The positioning stage is configured to move in multiple degrees of freedom of motion, e.g., three to six degrees of freedom, to allow the wafer 932 to be positioned at a desired position and orientation relative to the projection-optical system 938 and the reticle 916.

An EUVL system including the above-described EUV-source and illumination-optical system can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the illumination-optical system 922 and projection-optical system 938) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the EUVL system, further assessments, calibrations, and adjustments are made as required to ensure attainment of specified system accuracy and precision of operation. To maintain certain standards of cleanliness and avoidance of contamination, the EUVL system (as well as certain subsystems and assemblies of the system) are assembled in a clean room or the like in which particulate contamination, temperature, and humidity are controlled.

Figure 13:
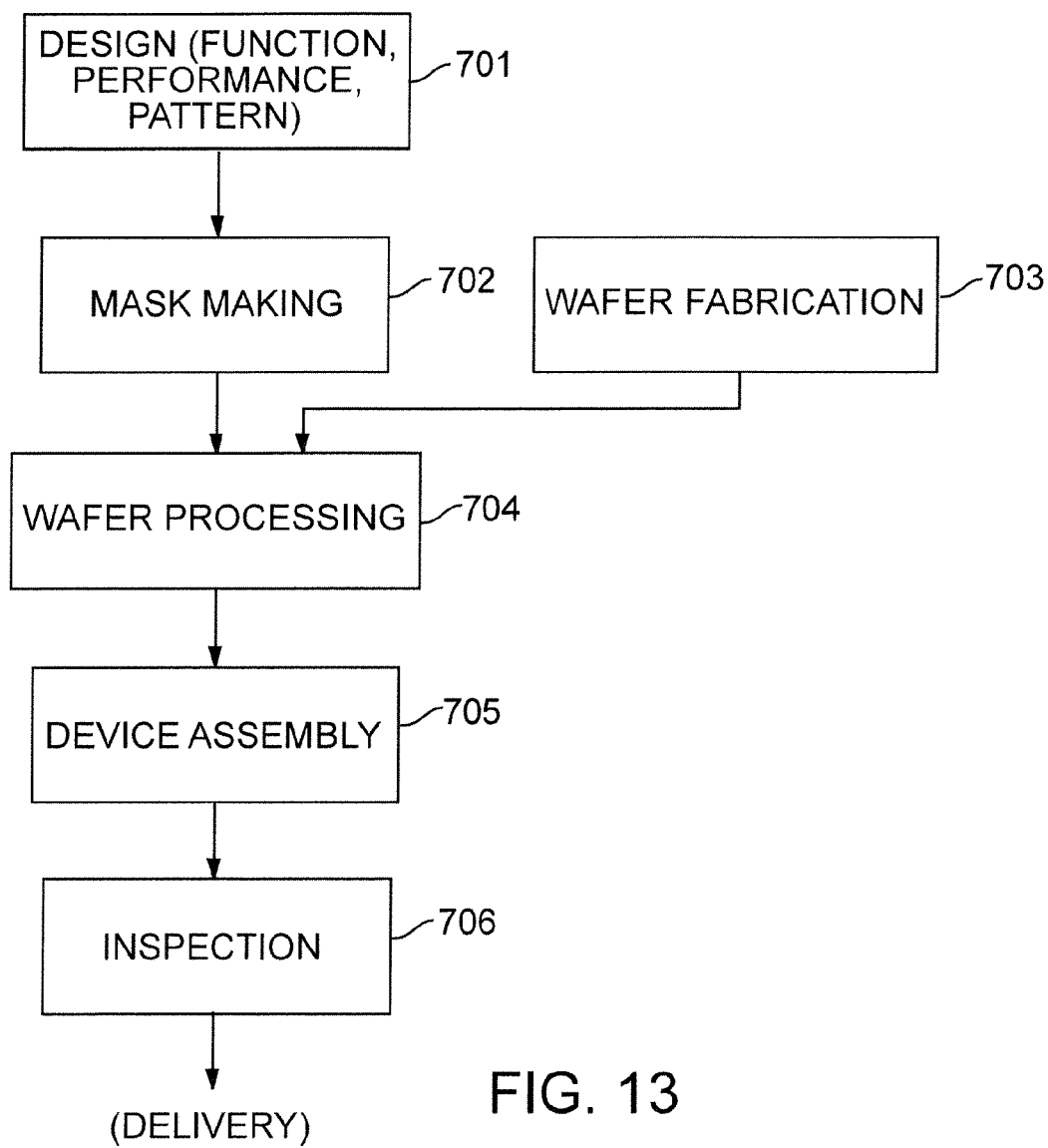
FIG. 13 is a process-flow diagram depicting exemplary steps associated with a process for fabricating semiconductor devices.

Semiconductor devices can be fabricated by processes including microlithography steps performed using a microlithography system as described above. Referring to FIG. 13, in step 701 the function and performance characteristics of the semiconductor device are designed. In step 702 a reticle ("mask") defining the desired pattern is designed and fabricated according to the previous design step. Meanwhile, in step 703, a substrate (wafer) is fabricated and coated with a suitable resist. In step 704 ("wafer processing") the reticle pattern designed in step 702 is exposed onto the surface of the substrate using the microlithography system. In step 705 the semiconductor device is assembled (including "dicing" by which individual devices or "chips" are cut from the wafer, "bonding" by which wires are bonded to particular locations on the chips, and "packaging" by which the devices are enclosed in appropriate packages for use). In step 706 the assembled devices are tested and inspected.

Figure 14:
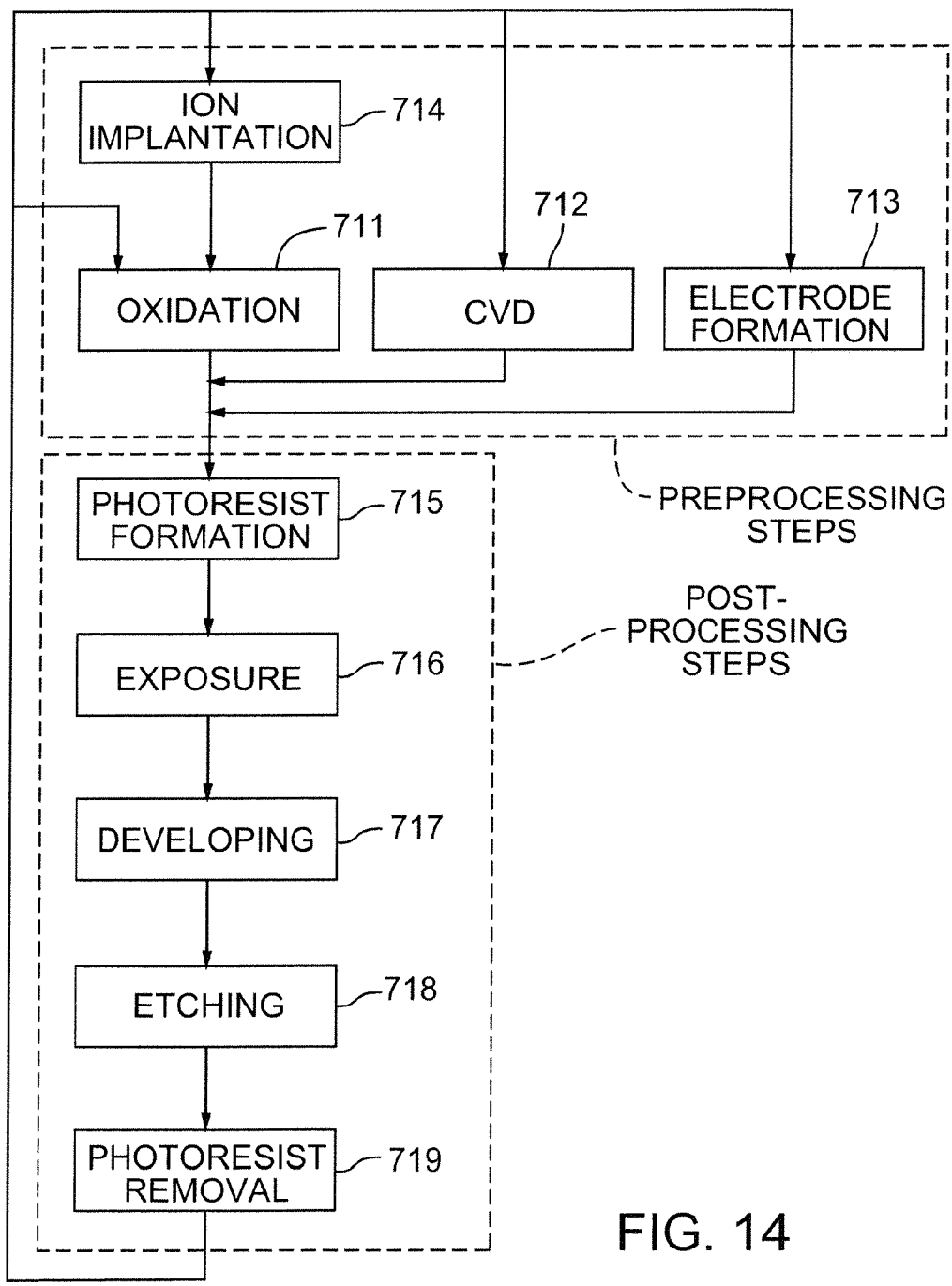
FIG. 14 is a process-flow diagram depicting exemplary steps associated with processing a substrate (e.g., a wafer), as would be performed, for example, in step 704 in the process shown in FIG. 13.

Representative details of a wafer-processing process including a microlithography step are shown in FIG. 14. In step 711 ("oxidation") the wafer surface is oxidized. In step 712 ("CVD") an insulative layer is formed on the wafer surface by chemical-vapor deposition. In step 713 (electrode formation) electrodes are formed on the wafer surface by vapor deposition, for example. In step 714 ("ion implantation") ions are implanted in the wafer surface. These steps 711-714 constitute representative "pre-processing" steps for wafers, and selections are made at each step according to processing requirements.

At each stage of wafer processing, when the pre-processing steps have been completed, the following "post-processing" steps are implemented. A first post-process step is step 715 ("photoresist formation") in which a suitable resist is applied to the surface of the wafer. Next, in step 716 ("exposure"), the microlithography system described above is used for lithographically transferring a pattern from the reticle to the resist layer on the wafer. In step 717 ("developing") the exposed resist on the wafer is developed to form a usable mask pattern, corresponding to the resist pattern, in the resist on the wafer. In step 718 ("etching"), regions not covered by developed resist (i.e., exposed material surfaces) are etched away to a controlled depth. In step 719 ("photoresist removal"), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

Whereas the invention has been described in connection with representative embodiments, it will be understood that it is not limited to those embodiments. On the contrary, it is intended to encompass all alternatives, modifications, and equivalents as may be included within the spirit and scope of the invention as defined by the appended claims.

What is claimed is:

1. In a stage assembly including a movable stage member, a counter-mass movable in reaction to motion of the stage member, and at least one driver coupled to the counter-mass, a method for controlling the at least one driver, the method comprising:
    comparing an actual position of the counter-mass in a plane to a corresponding reference position in the plane to produce at least one following-error, the actual position of the counter-mass corresponding to a position of the stage member;
    determining a first force command based at least in part on the at least one following-error and the position of the stage member; and
    driving the at least one driver based at least in part on one of the first force command or a second force command, the second force command being a limited force command determined by a force limiter based on the first force command when the first force command exceeds a predetermined force limitation of the at least one driver;
    wherein when driving the at least one driver based on the first force command, the counter-mass is moved by a first force that causes a displacement of the counter-mass corresponding to a displacement of the stage member, and
    wherein when driving the at least one driver based on the second force command, the counter-mass is moved by a second force that is smaller than the first force, and which causes a displacement of the counter-mass.

2. The method of claim 1, wherein the following-error comprises an x-direction following-error, a y-direction following error, and a $\theta_z$ following-error.

3. The method of claim 2, wherein the compared actual position of the counter-mass comprises an x-position component, a y-position component, and a $\theta_z$-position component.

4. The method of claim 1, wherein
driving the counter-mass with the second force is sufficient to prevent saturation of the at least one driver coupled to the counter-mass.

5. The method of claim 1, wherein:
the following error is in an x-y plane and comprises x-direction, y-direction, and $\theta_z$, following errors;
the first force command includes multiple first force commands based at least in part on feedback-controlled CG force commands comprising X, Y, and $\theta_z$, force commands; and
the first force commands are trim-motor force commands corresponding to the CG force commands and comprise a first X trim-motor force command, a second X trim-motor force command, and a Y trim-motor force command.

6. A device manufacturing method, comprising:
exposing an object by controlling the least one drive, which moves the object, according to claim 1; and
developing the object that has been exposed.

7. The method of claim 1, further comprising:
feeding back the second force command and an actual limited trim-motor force command as an actual CG force command;
comparing the actual CG force command with the corresponding feedback-controlled CG force command produced from a transfer function having at least one integral term to produce a difference; and
modifying the at least one integral term of the transfer function according to the difference.

8. The stage assembly of claim 1, wherein the displacement of the counter-mass caused by the second force is less than the displacement of the counter-mass associated with the first force.

9. The stage assembly of claim 1, wherein the predetermined force limitation is based at least in part on a saturation limit of the at least one driver.

10. A stage assembly, comprising:
a base member;
a stage member movable relative to the base member;
a counter-mass movable relative to the base member, wherein the counter-mass is coupled to a stage driver so as to move in association with movement of the stage member;
at least one driver coupled to the counter-mass and the base member, the at least one driver being operable to move the counter-mass; and
a controller that determines a first force command based at least in part on a position of the stage member, the controller being operable to limit the first force command if the first force command exceeds a predetermined force limitation of the at least one driver to produce a second force command, the controller being operable to cause the at least one driver to apply force to the counter-mass based at least in part on one of the first force command or the second force command;
wherein when the controller causes the at least one driver to apply force to the counter-mass based on the first force command, the counter-mass is moved by a first force that causes a displacement of the counter-mass corresponding to a displacement of the stage member; and wherein when the controller causes the at least one driver to apply force to the counter-mass based on the second force command, the counter-mass is moved by a second force that is less than the first force.

11. The stage assembly of claim 10, wherein the counter-mass is movable within a predetermined range, and the controller controls the at least one driver to generate the second force at an end limit of the predetermined range of the stage member.

12. The stage assembly of claim 10, wherein the controller compares an actual position of the counter-mass to a corresponding reference position of the counter-mass based on the position of the stage member.

13. An exposure apparatus comprising a stage assembly as recited in claim 10.

14. A device manufacturing method, comprising:
exposing an object using the exposure apparatus according to claim 13; and
developing the object that has been exposed.

15. The stage assembly of claim 10, wherein the controller further comprises a PI feedback controller to receive following-errors of the counter-mass and generate force commands for the first force.

16. The stage assembly of claim 15, wherein the controller is further configured to feed back the force commands for the second force, as actual CG force commands, to the feedback controller to modify integral terms of the feedback controller according to the force commands for the second force.

17. The stage assembly of claim 15, further comprising a stage motor coupled to the stage member and to the counter-mass such that motion of the stage member imparted by the stage motor causes a reactive motion of the counter-mass counter to the motion of the stage member.

18. The stage assembly of claim 15, wherein the force limiter is a trim-motor force limiter, and the controller further comprises
a force-distribution matrix operably coupled between the PI feedback controller and the trim-motor force limiter, the force-distribution matrix converting CG force commands to corresponding trim-motor force commands input to the trim-motor force limiter.

19. The stage assembly of claim 10, wherein:
the controller receiving following errors of the counter-mass further generates corresponding center-of-gravity (CG) force commands; and
the first and second force commands correspond, at least in part, to the CG force commands and are delivered to at least one trim-motor to produce a corrective motion of the counter-mass.

20. The stage assembly of claim 10, wherein:
the stage member is movable by the stage motor in an x-y plane defined by an x-axis and a y-axis;
the at least one driver coupled to the counter-mass comprises at least one trim-motor configured to move the counter-mass in an x-axis direction, and at least one trim-motor configured to move the counter-mass in a y-axis direction.

21. A precision system comprising a stage assembly as recited in claim 10.

22. A microlithography system comprising a stage assembly as recited in claim 10.

23. The stage assembly of claim 10, wherein the second force causes a displacement of the counter-mass that is less than the displacement associated with the first force.

24. The stage assembly of claim 10, wherein the predetermined force limitation is based at least in part on a saturation limit of the at least one driver.

\* \* \* \* \*